United States Patent
Sasada et al.

(10) Patent No.: US 12,284,904 B2
(45) Date of Patent: Apr. 22, 2025

(54) LIGHT EMITTING DEVICE AND PRODUCTION METHOD THEREOF, AND COMPOSITION FOR LIGHT EMITTING DEVICE AND PRODUCTION METHOD THEREOF

(71) Applicant: Sumitomo Chemical Company, Limited, Tokyo (JP)

(72) Inventors: Toshiaki Sasada, Tsukuba (JP); Ryuji Matsumoto, Nomi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 821 days.

(21) Appl. No.: 17/442,893

(22) PCT Filed: Mar. 29, 2019

(86) PCT No.: PCT/JP2019/014087
§ 371 (c)(1),
(2) Date: Sep. 24, 2021

(87) PCT Pub. No.: WO2020/202279
PCT Pub. Date: Oct. 8, 2020

(65) Prior Publication Data
US 2022/0199904 A1    Jun. 23, 2022

(51) Int. Cl.
H01L 51/00    (2006.01)
H10K 85/30    (2023.01)
H10K 85/60    (2023.01)
H10K 50/11    (2023.01)
H10K 101/10   (2023.01)

(52) U.S. Cl.
CPC ......... *H10K 85/322* (2023.02); *H10K 85/623* (2023.02); *H10K 85/626* (2023.02); *H10K 85/636* (2023.02); *H10K 85/6572* (2023.02); *H10K 85/6576* (2023.02); *H10K 50/11* (2023.02); *H10K 2101/10* (2023.02)

(58) Field of Classification Search
CPC .. H10K 85/622; H10K 85/623; H10K 85/615; H10K 85/322; H10K 85/658
See application file for complete search history.

(56) References Cited

U.S. PATENT DOCUMENTS

| | | | |
|---|---|---|---|
| 2003/0157366 A1 | 8/2003 | Matsuura et al. | |
| 2009/0110957 A1* | 4/2009 | Begley | H05B 33/22 428/690 |
| 2011/0226992 A1 | 9/2011 | Takeshima et al. | |
| 2018/0094000 A1 | 4/2018 | Hatakeyama et al. | |
| 2018/0123056 A1 | 5/2018 | Sasada et al. | |
| 2019/0058124 A1* | 2/2019 | Hatakeyama | H10K 85/658 |

FOREIGN PATENT DOCUMENTS

| | | | |
|---|---|---|---|
| CN | 106467553 A | 3/2017 | |
| JP | 2006114844 A | 4/2006 | |
| JP | 2008227512 A | 9/2008 | |
| JP | 2017193618 A | 10/2017 | |
| JP | 2019530109 | 2/2020 | |
| WO | 2010032453 A1 | 3/2010 | |
| WO | 201617067 A1 | 2/2016 | |
| WO | 2016152418 A1 | 9/2016 | |
| WO | WO-2017138526 A1 * | 8/2017 | ............... C07F 5/02 |
| WO | 2018062278 A1 | 4/2018 | |

OTHER PUBLICATIONS

FIT_translation_of_CN_106467553_A_I (Year: 2024).*
FIT_translation_of_Kondo_JP_2017193618_A_I (Year: 2024).*
IT_translation_of_Takeshima_et_al_WO_2010032453_A1_I (Year: 2024).*
Int'l Search Report issued Jun. 25, 2019 in Int'l Application No. PCT/JP2019/014087.
Int'l Written Opinion issued Jun. 25, 2019 in Int'l Application No. PCT/JP2019/014087.
Office Action issued Jul. 8, 2019 in Japanese Application No. 2019-530109.
Office Action issued Nov. 8, 2019 in Japanese Application No. 2019-530109.
European Examination Report issued Jan. 29, 2024 in EP Application No. EP19922768.7.
Office Action issued Oct. 18, 2022 in Japanese Application No. 2019-236438 (English machine translation).
European Search Report issued Oct. 17, 2022 in EPO Application No. EP19922768.7.

* cited by examiner

*Primary Examiner* — Michael M Dollinger
(74) *Attorney, Agent, or Firm* — Panitch Schwarze Belisario & Nadel LLP

(57) ABSTRACT

A light emitting device having an anode, a cathode, and an organic layer disposed between the anode and the cathode and containing a composition is described. The composition contains a compound (A) represented by the formula (FH) and a compound (B) having a condensed hetero ring skeleton (b) containing a boron atom and a nitrogen atom in the ring, and the molecular weight (MA) of the compound (A) and the molecular weight (MB) of the compound (B) satisfy the formula (M1-1) and the formula (M2-1).

$$400 \leq MA + MB \leq 2000 \quad (M1\text{-}1)$$

$$0.30 \leq MA/(MA + MB) \leq 0.70 \quad (M2\text{-}1)$$

[Chemical Formula 1]

$$Ar^{1H}\text{---}(R^{1H})_{n1H} \quad (FH)$$

6 Claims, No Drawings

LIGHT EMITTING DEVICE AND PRODUCTION METHOD THEREOF, AND COMPOSITION FOR LIGHT EMITTING DEVICE AND PRODUCTION METHOD THEREOF

CROSS-REFERENCE TO RELATED APPLICATIONS

This application is a Section 371 of International Application No. PCT/JP2019/014087, filed Mar. 29, 2019, which was published in the Japanese language on Oct. 8, 2020 under International Publication No. WO 2020/202279 A1, the disclosure of which is incorporated herein by reference in its entirety.

TECHNICAL FIELD

The present invention relates to a light emitting device and a production method thereof. Further, the present invention relates to a composition for light emitting device and a production method thereof.

BACKGROUND ART

Light emitting devices such as an organic electroluminescent device and the like can be suitably used, for example, for display and illumination. As the light emitting material used for a light emitting layer of a light emitting device, for example, Patent Document 1 suggests a composition containing a compound H1 and a compound G1.

[Chemical Formula 1]

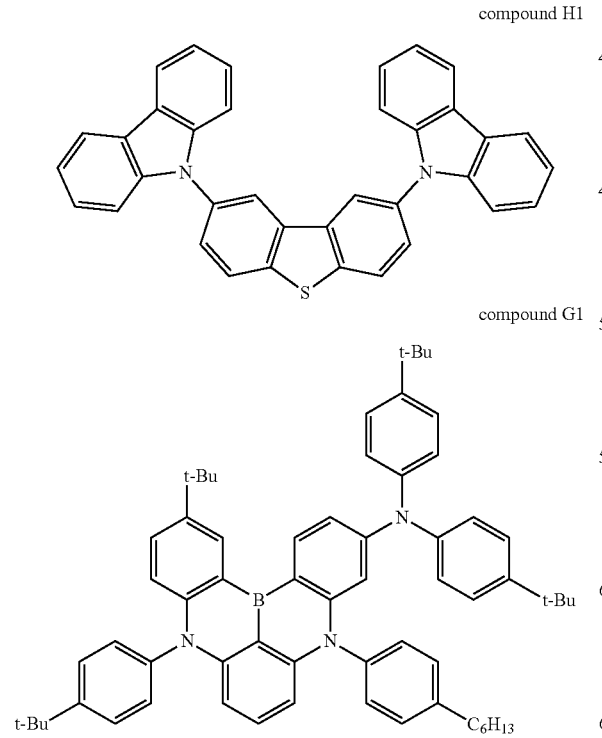

PRIOR ART DOCUMENT

Patent Document

[Patent Document 1] International Publication WO2018/062278

SUMMARY OF THE INVENTION

Problem to be Solved by the Invention

However, the light emitting device fabricated using the above-described composition did not necessarily has sufficiently low driving voltage.

Then, the present invention has an object of providing a composition which is useful for producing a light emitting device having low driving voltage, and an object of providing a light emitting device comprising the composition.

Means for Solving the Problem

The present inventors have intensively studied for solving the above-described problem and resultantly found that if, in a composition for light emitting device containing a specific compound (A) and a specific compound (B), the molecular weight (MA) of the compound (A) and the molecular weight (MB) of the compound (B) satisfy a specific relationship, then, a light emitting device having low driving voltage is formed, leading to completion of the present invention.

That is, the present invention provides the following [1] to [15].

[1] A light emitting device comprising
an anode,
a cathode, and
an organic layer disposed between the above-described anode and the above-described cathode and containing a composition for light emitting device,
wherein
the above-described composition for light emitting device contains
a compound (A) represented by the formula (FH), and
a compound (B) having a condensed hetero ring skeleton (b) containing a boron atom and a nitrogen atom in the ring,
and
the molecular weight (MA) of the above-described compound (A) and the molecular weight (MB) of the above-described compound (B) satisfy the formula (M1-1) and the formula (M2-1):

$$400 \leq MA + MB \leq 2000 \quad (M1\text{-}1)$$

$$0.30 \leq MA/(MA + MB) \leq 0.70 \quad (M2\text{-}1)$$

[Chemical Formula 2]

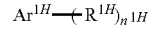

(FH)

[wherein, $n^{1H}$
$n^{1H}$ represents an integer of 0 or more.
$Ar^{1H}$ represents a group obtained by removing from an aromatic hydrocarbon $n^{1H}$ or more hydrogen atoms bonding directly to atoms constituting the ring, and this group optionally has a substituent. When a plurality of the substituents are present, they may be the same or different and may be combined together to form a ring together with atoms to which they are attached.

R$^{1H}$ represents an aryl group, a monovalent hetero ring group or a substituted amino group, and these groups optionally have a substituent. When a plurality of the substituents are present, they may be the same or different and may be combined together to form a ring together with atoms to which they are attached. When a plurality of R$^{1H}$ are present, they may be the same or different. The above-described monovalent hetero ring group is a group obtained by removing from a heterocyclic compound not having the above-described condensed hetero ring skeleton (b) one hydrogen atom bonding directly to an atom constituting the ring, and this group optionally has a substituent.].

[2] The light emitting device according to [1], wherein the above-described aromatic hydrocarbon represented by the above-described Ar$^{1H}$ is a polycyclic aromatic hydrocarbon.

[3] The light emitting device according to [2], wherein the above-described polycyclic aromatic hydrocarbon represented by the above-described Ar$^{1H}$ is a tricyclic, tetracyclic or pentacyclic aromatic hydrocarbon.

[4] The light emitting device according to any one of [1] to [3], wherein the above-described compound (B) is a compound represented by the formula (1-1), a compound represented by the formula (1-2) or a compound represented by the formula (1-3):

[Chemical Formula 3]

(1-1)

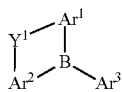

(1-2)

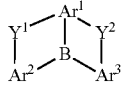

(1-3)

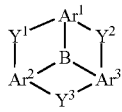

[wherein,

Ar$^1$, Ar$^2$ and Ar$^3$ each independently represent an aromatic hydrocarbon group or a hetero ring group, and these groups optionally have a substituent. When a plurality of the substituents are present, they may be the same or different and may be combined together to form a ring together with atoms to which they are attached.

Y$^1$ represents a group represented by —N(Ry)-.

Y$^2$ and Y$^3$ each independently represent a single bond, an oxygen atom, a sulfur atom, a selenium atom, a group represented by —N(Ry)-, an alkylene group or a cycloalkylene group, and these groups optionally have a substituent. When a plurality of the substituents are present, they may be the same or different and may be combined together to form a ring together with atoms to which they are attached. Ry represents a hydrogen atom, an alkyl group, a cycloalkyl group, an aryl group or a monovalent hetero ring group, and these groups optionally have a substituent. When a plurality of the substituents are present, they may be the same or different and may be combined together to form a ring together with atoms to which they are attached. When a plurality of Ry are present, they may be the same or different. Ry may be bonded directly or via a connecting group to Ar$^1$, Ar$^2$ or Ar$^3$.].

[5] The light emitting device according to [4], wherein the above-described Y$^2$ and the above-described Y$^3$ are groups represented by —N(Ry)-.

[6] The light emitting device according to any one of [1] to [5], wherein the above-described composition for light emitting device further contains at least one selected from the group consisting of a hole transporting material, a hole injection material, an electron transporting material, an electron injection material, a light emitting material, an antioxidant and a solvent.

[7] A composition for light emitting device comprising
a compound (A) represented by the formula (FH), and
a compound (B) having a condensed hetero ring skeleton (b) containing a boron atom and a nitrogen atom in the ring, wherein
the molecular weight (MA) of the above-described compound (A) and the molecular weight (MB) of the above-described compound (B) satisfy the formula (M1-1) and the formula (M2-1):

$$400 \leq MA + MB \leq 2000 \quad (M1\text{-}1)$$

$$0.30 \leq MA/(MA + MB) \leq 0.70 \quad (M2\text{-}1)$$

[Chemical Formula 4]

(FH)

[wherein, n$^{1H}$ represents an integer of 0 or more.

Ar$^{1H}$ represents a group obtained by removing from an aromatic hydrocarbon n$^{1H}$ or more hydrogen atoms bonding directly to atoms constituting the ring, and this group optionally has a substituent. When a plurality of the substituents are present, they may be the same or different and may be combined together to form a ring together with atoms to which they are attached.

R$^{1H}$ represents an aryl group, a monovalent hetero ring group or a substituted amino group, and these groups optionally have a substituent. When a plurality of the substituents are present, they may be the same or different and may be combined together to form a ring together with atoms to which they are attached. When a plurality of R$^{1H}$ are present, they may be the same or different. The above-described monovalent hetero ring group is a group obtained by removing from a heterocyclic compound not having the above-described condensed hetero ring skeleton (b) one hydrogen atom bonding directly to an atom constituting the ring, and this group optionally has a substituent.].

[8] The composition for light emitting device according to [7], wherein the above-described aromatic hydrocarbon represented by the above-described Ar$^{1H}$ is a polycyclic aromatic hydrocarbon.

[9] The composition for light emitting device according to [8], wherein the above-described aromatic hydrocarbon represented by the above-described Ar$^{1H}$ is a tricyclic, tetracyclic or pentacyclic aromatic hydrocarbon.

[10] The composition for light emitting device according to any one of [7] to [9], wherein the above-described compound (B) is a compound represented by the formula (1-1), a compound represented by the formula (1-2) or a compound represented by the formula (1-3)

[Chemical Formula 5]

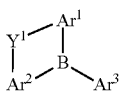 (1-1)

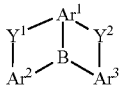 (1-2)

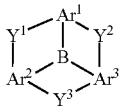 (1-3)

[wherein,

Ar¹, Ar² and Ar³ each independently represent an aromatic hydrocarbon group or a hetero ring group, and these groups optionally have a substituent. When a plurality of the substituents are present, they may be the same or different and may be combined together to form a ring together with atoms to which they are attached.

$Y^1$ represents a group represented by —N(Ry)-.

$Y^2$ and $Y^3$ each independently represent a single bond, an oxygen atom, a sulfur atom, a selenium atom, a group represented by —N(Ry)-, an alkylene group or a cycloalkylene group, and these groups optionally have a substituent. When a plurality of the substituents are present, they may be the same or different and may be combined together to form a ring together with atoms to which they are attached. Ry represents a hydrogen atom, an alkyl group, a cycloalkyl group, an aryl group or a monovalent hetero ring group, and these groups optionally have a substituent. When a plurality of the substituents are present, they may be the same or different and may be combined together to form a ring together with atoms to which they are attached. When a plurality of Ry are present, they may be the same or different. Ry may be bonded directly or via a connecting group to Ar¹, Ar² or Ar³.].

[11] The composition for light emitting device according to [10], wherein the above-described $Y^2$ and the above-described $Y^3$ are groups represented by —N(Ry)-.

[12] The composition for light emitting device according to any one of [7] to [11], wherein the above-described composition for light emitting device further contains at least one selected from the group consisting of a hole transporting material, a hole injection material, an electron transporting material, an electron injection material, a light emitting material, an antioxidant and a solvent.

[13] A method for producing a composition for light emitting device, comprising a preparation step of preparing one of the compound (A) represented by the formula (FH) and the compound (B) having a condensed hetero ring skeleton (b) containing a boron atom and a nitrogen atom in the ring, a sorting step of sorting the other of the above-described compound (A) and the above-described compound (B) such that the molecular weight (MA) of the above-described compound (A) and the molecular weight (MB) of the above-described compound (B) satisfy the formula (M1-1) and the formula (M2-1), and a composition production step of mixing the compound prepared in the above-described preparation step and the compound sorted in the above-described sorting step to obtain a composition for light emitting device:

$$400 \leq MA + MB \leq 2000 \quad (M1\text{-}1)$$

$$0.30 \leq MA/(MA + MB) \leq 0.70 \quad (M2\text{-}1)$$

[Chemical Formula 6]

$$Ar^{1H}\text{—}(R^{1H})_{n^{1H}} \quad (FH)$$

[wherein, $n^{1H}$ represents an integer of 0 or more.

$Ar^{1H}$ represents a group obtained by removing from an aromatic hydrocarbon $n^{1H}$ or more hydrogen atoms bonding directly to atoms constituting the ring, and this group optionally has a substituent. When a plurality of the substituents are present, they may be the same or different and may be combined together to form a ring together with atoms to which they are attached.

$R^{1H}$ represents an aryl group, a monovalent hetero ring group or a substituted amino group, and these groups optionally have a substituent. When a plurality of the substituents are present, they may be the same or different and may be combined together to form a ring together with atoms to which they are attached. When a plurality of $R^{1H}$ are present, they may be the same or different. The above-described monovalent hetero ring group is a group obtained by removing from a heterocyclic compound not having the above-described condensed hetero ring skeleton (b) one hydrogen atom bonding directly to an atom constituting the ring, and this group optionally has a substituent.].

[14] A method for producing a light emitting device having an anode, a cathode, and an organic layer disposed between the above-described anode and the above-described cathode, comprising a first step of producing a composition for light emitting device by the production method as described in [13], and a second step of disposing the organic layer containing the above-described composition for light emitting device between the anode and the cathode.

[15] A method for producing a light emitting device, comprising a step of preparing a first light emitting device having an anode, a cathode, and a first organic layer disposed between the above-described anode and the above-described cathode, and a step of producing a second light emitting device having a structure in which the above-described first organic layer is replaced by a second organic layer and having driving voltage lower than that of the above-described first light emitting device, wherein the above-described first organic layer contains a compound (A) represented by the formula (FH) and a compound (B) having a condensed hetero ring skeleton (b) containing a boron atom and a nitrogen atom in the ring in a combination by which the molecular weight (MA) of the above-described compound (A) and the molecular weight (MB) of the above-described compound (B) do not satisfy the formula (M1-1) and the formula (M2-1), and the above-described second organic layer contains the above-described compound (A) and the above-described compound (B) in a combination by which the molecular weight (MA) of the above-described compound (A) and the molecular weight (MB) of the above-described compound (B) satisfy the formula (M1-1) and the formula (M2-1):

$$400 \leq MA + MB \leq 2000 \quad \text{(M1-1)}$$

$$0.30 \leq MA/(MA + MB) \leq 0.70 \quad \text{(M2-1)}$$

[Chemical Formula 7]

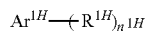 (FH)

[wherein, n$^{1H}$ represents an integer of 0 or more.

Ar$^{1H}$ represents a group obtained by removing from an aromatic hydrocarbon n$^{1H}$ or more hydrogen atoms bonding directly to atoms constituting the ring, and this group optionally has a substituent. When a plurality of the substituents are present, they may be the same or different and may be combined together to form a ring together with atoms to which they are attached.

R$^{1H}$ represents an aryl group, a monovalent hetero ring group or a substituted amino group, and these groups optionally have a substituent. When a plurality of the substituents are present, they may be the same or different and may be combined together to form a ring together with atoms to which they are attached. When a plurality of R$^{1H}$ are present, they may be the same or different. The above-described monovalent hetero ring group is a group obtained by removing from a heterocyclic compound not having the above-described condensed hetero ring skeleton (b) one hydrogen atom bonding directly to an atom constituting the ring, and this group optionally has a substituent.].

Effect of the Invention

According to the present invention, it is possible to provide a composition which is useful for producing a light emitting device having low driving voltage and a production method thereof. Further, according to the present invention, it is possible to provide a light emitting device comprising the composition and a production method thereof.

MODES FOR CARRYING OUT THE INVENTION

Suitable embodiments of the present invention will be illustrated in detail below.
<Explanation of Common Terms>
Terms commonly used in the present specification have the following meanings unless otherwise stated.

"Room temperature" denotes 25° C.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

"The low molecular weight compound" means a compound having no molecular weight distribution and having a molecular weight of 1×10$^4$ or less.

"The polymer compound" means a polymer having molecular weight distribution and having a polystyrene-equivalent number-average molecular weight of 1×10$^3$ or more (for example, 1×10$^3$ to 1×10$^8$).

"The constitutional unit" means a unit occurring once or more times in the polymer compound.

The polymer compound may be any of a block copolymer, a random copolymer, an alternating copolymer and a graft copolymer, and may also be another form.

The end group of the polymer compound is preferably a stable group since if a polymerization active group remains intact there, there is a possibility of a decrease in light emitting properties or luminance life when the polymer compound is used for fabrication of a light emitting device. The end group of the polymer compound is preferably a group conjugatively bonded to the main chain and includes, for example, groups bonding to an aryl group or a monovalent hetero ring group linking to the main chain of the polymer compound via a carbon-carbon bond.

"The alkyl group" may be any of linear and branched. The number of carbon atoms of the linear alkyl group, not including the number of carbon atoms of the substituent, is usually 1 to 50, preferably 1 to 20, and more preferably 1 to 10. The number of carbon atoms of the branched alkyl group, not including the number of carbon atoms of the substituent, is usually 3 to 50, preferably 3 to 20, and more preferably 4 to 10.

The alkyl group optionally has a substituent. The alkyl group includes, for example, a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group. Further, the alkyl group may also be a group obtained by substituting a part or all of hydrogen atoms in these groups with a cycloalkyl group, an alkoxy group, a cycloalkoxy group, an aryl group, a fluorine atom or the like. Such an alkyl group includes, for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group and a 6-ethyloxyhexyl group.

The number of carbon atoms of "the cycloalkyl group", not including the number of carbon atoms of the substituent, is usually 3 to 50, and preferably 4 to 10. The cycloalkyl group optionally has a substituent. The cycloalkyl group includes, for example, a cyclohexyl group and a methylcyclohexyl group.

The number of carbon atoms of "the alkylene group", not including the number of carbon atoms of the substituent, is usually 1 to 20, preferably 1 to 15, and more preferably 1 to 10. The alkylene group optionally has a substituent. The alkylene group includes, for example, a methylene group, an ethylene group, a propylene group, a butylene group, a hexylene group and an octylene group.

The number of carbon atoms of "the cycloalkylene group", not including the number of carbon atoms of the substituent, is usually 3 to 20, and preferably 4 to 10. The cycloalkylene group optionally has a substituent. The cycloalkylene group includes, for example, a cyclohexylene group.

"The aromatic hydrocarbon group" means a group obtained by removing from an aromatic hydrocarbon one or more hydrogen atoms bonding directly to atoms constituting the ring. The group obtained by removing from an aromatic hydrocarbon one hydrogen atom bonding directly to an atom constituting the ring is referred to also as "aryl group". The group obtained by removing from an aromatic hydrocarbon two hydrogen atoms bonding directly to atoms constituting the ring is referred to also as "arylene group".

The number of carbon atoms of the aromatic hydrocarbon group, not including the number of carbon atoms of the substituent, is usually 6 to 60, preferably 6 to 40, and more preferably 6 to 20.

"The aromatic hydrocarbon group" includes, for example, groups obtained by removing from a monocyclic aromatic hydrocarbon (including, for example, benzene) or a polycyclic aromatic hydrocarbon (including, for example, dicyclic aromatic hydrocarbons such as naphthalene, indene and the like; tricyclic aromatic hydrocarbons such as anthracene, phenanthrene, dihydrophenanthrene, fluorene and the like; tetracyclic aromatic hydrocarbons such as benzoanthracene, benzophenanthrene, benzofluorene, pyrene, fluoranthene and the like; pentacyclic aromatic hydrocarbons such as dibenzoanthracene, dibenzophenanthrene, dibenzofluorene, perylene, benzofluoranthene and the like; hexacyclic aromatic hydrocarbons such as spirobifluorene and the like; and, heptacyclic aromatic hydrocarbons such as benzospirobifluorene, acenaphthofluoranthene and the like) one or more hydrogen atoms bonding directly to atoms constituting the ring. The aromatic hydrocarbon group includes groups obtained by bonding a plurality of these groups. The aromatic hydrocarbon group optionally has a substituent.

"The alkoxy group" may be any of linear and branched. The number of carbon atoms of the linear alkoxy group, not including the number of carbon atoms of the substituent, is usually 1 to 40, and preferably 1 to 10. The number of carbon atoms of the branched alkoxy group, not including the number of carbon atoms of the substituent, is usually 3 to 40, and preferably 4 to 10.

The alkoxy group optionally has a substituent. The alkoxy group includes, for example, a methoxy group, an ethoxy group, an isopropyloxy group, a butyloxy group, a hexyloxy group, a 2-ethylhexyloxy group, a 3,7-dimethyloctyloxy group and a lauryloxy group.

The number of carbon atoms of "the cycloalkoxy group", not including the number of carbon atoms of the substituent, is usually 3 to 40, and preferably 4 to 10. The cycloalkoxy group optionally has a substituent. The cycloalkoxy group includes, for example, a cyclohexyloxy group.

The number of carbon atoms of "the aryloxy group", not including the number of carbon atoms of the substituent, is usually 6 to 60, preferably 6 to 40, and more preferably 6 to 20. The aryloxy group optionally has a substituent. The aryloxy group includes, for example, a phenoxy group, a naphthyloxy group, an anthracenyloxy group and a pyrenyloxy group.

"The hetero ring group" means a group obtained by removing from a heterocyclic compound one or more hydrogen atoms bonding directly to atoms constituting the ring. Of the hetero ring groups, "an aromatic hetero ring group" which is a group obtained by removing from an aromatic heterocyclic compound one or more hydrogen atoms bonding directly to atoms constituting the ring is preferred. The group obtained by removing from a heterocyclic compound p hydrogen atoms (p represents an integer of 1 or more) bonding directly to atoms constituting the ring is referred to also as "p-valent hetero ring group". The group obtained by removing from an aromatic heterocyclic compound p hydrogen atoms bonding directly to atoms constituting the ring is referred to also as "p-valent aromatic hetero ring group".

"The aromatic heterocyclic compound" includes, for example, compounds in which the hetero ring itself shows aromaticity such as azole, thiophene, furan, pyridine, diazabenzene, triazine, azanaphthalene, diazanaphthalene, carbazole and the like, and compounds in which an aromatic ring is condensed to a hetero ring even if the hetero ring itself shows no aromaticity such as phenoxazine, phenothiazine, benzopyran and the like.

The number of carbon atoms of the hetero ring group, not including the number of carbon atoms of the substituent, is usually 1 to 60, preferably 2 to 40, and more preferably 3 to 20. The number of hetero atoms of the aromatic hetero ring group, not including the number of carbon atoms of the substituent, is usually 1 to 30, preferably 1 to 10, more preferably 1 to 5, and further preferably 1 to 3.

The hetero ring group includes, for example, groups obtained by removing from a monocyclic heterocyclic compound (including, for example, furan, thiophene, oxadiazole, pyrrole, diazole, triazole, tetrazole, pyridine, diazabenzene and triazine) or a polycyclic heterocyclic compound (including, for example, dicyclic heterocyclic compounds such as azanaphthalene, diazanaphthalene, benzofuran, benzothiophene, indole, benzodiazole, benzothiadiazole and the like; tricyclic heterocyclic compounds such as dibenzofuran, dibenzothiophene, dibenzoborole, dibenzosilole, dibenzophosphole, dibenzcselenophene, carbazole, azacarbazole, diazacarbazole, phenoxazine, phenothiazine, 9,10-dihydroacridine, 5,10-dihydrophenazine, phenazaborine, phenophosphazine, phenoselenazine, phenazasiline, azaanthracene, diazaanthracene, azaphenanthrene, diazaphenanthrene and the like; tetracyclic heterocyclic compounds such as hexaazatriphenylene, benzocarbazole, benzonaphthofuran, benzonaphthothiophene and the like; pentacyclic heterocyclic compounds such as dibenzocarbazole, indolocarbazole, indenocarbazole and the like; hexacyclic heterocyclic compounds such as carbazolocarbazole, benzoindolocarbazole, benzoindenocarbazole and the like; and, heptacyclic heterocyclic compounds such as dibenzoindolocarbazole and the like) one or more hydrogen atoms bonding directly to atoms constituting the ring. The hetero ring group includes groups obtained by bonding a plurality of these groups. The hetero ring group optionally has a substituent.

"The halogen atom" denotes a fluorine atom, a chlorine atom, a bromine atom or an iodine atom.

"The amino group" optionally has a substituent, and substituted amino groups (namely, secondary amino groups or tertiary amino groups, more preferably tertiary amino groups) are preferred. The substituent which the amino group has is preferably an alkyl group, a cycloalkyl group, an aryl group or a monovalent hetero ring group. When a plurality of the substituents which the amino group has are present, they may be the same or different and may be combined together to form a ring together with nitrogen atoms to which they are attached.

The substituted amino group includes, for example, a dialkylamino group, a dicycloalkylamino group and a diarylamino group.

The amino group includes, for example, a dimethylamino group, a diethylamino group, a diphenylamino group, a bis(methylphenyl)amino group and a bis(3,5-di-tert-butylphenyl)amino group.

"The alkenyl group" may be any of linear or branched. The number of carbon atoms of the linear alkenyl group, not including the number of carbon atoms of the substituent, is usually 2 to 30, and preferably 3 to 20. The number of carbon atoms of the branched alkenyl group, not including the number of carbon atoms of the substituent, is usually 3 to 30, and preferably 4 to 20.

The number of carbon atoms of "the cycloalkenyl group", not including the number of carbon atoms of the substituent, is usually 3 to 30, and preferably 4 to 20.

The alkenyl group and the cycloalkenyl group optionally have a substituent. The alkenyl group includes, for example, a vinyl group, a 1-propenyl group, a 2-butenyl group, a 3-butenyl group, a 3-pentenyl group, a 4-pentenyl group, a 1-hexenyl group, a 5-hexenyl group and a 7-octenyl group, and groups obtained by substituting a part or all of hydrogen atoms in these groups with a substituent. The cycloalkenyl group includes, for example, a cyclohexenyl group, a cyclohexadienyl group, a cyclooctatrienyl group and a norbornylenyl group, and groups obtained by substituting a part or all of hydrogen atoms in these groups with a substituent.

"The alkynyl group" may be any of linear or branched. The number of carbon atoms of the alkynyl group, not including carbon atoms of the substituent, is usually 2 to 20, and preferably 3 to 20. The number of carbon atoms of the branched alkynyl group, not including carbon atoms of the substituent, is usually 4 to 30, and preferably 4 to 20.

The number of carbon atoms of "the cycloalkynyl group", not including carbon atoms of the substituent, is usually 4 to 30, and preferably 4 to 20.

The alkynyl group and the cycloalkynyl group optionally have a substituent. The alkynyl group includes, for example, an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and groups obtained by substituting a part or all of hydrogen atoms in these groups with a substituent. The cycloalkynyl group includes, for example, a cyclooctynyl group.

"The cross-linkable group" refers to a group capable of generating a new bond by being subjected to a heating treatment, an ultraviolet irradiation treatment, a near-ultraviolet irradiation treatment, a visible light irradiation treatment, an infrared irradiation treatment, a radical reaction and the like. As the cross-linkable group, cross-linkable groups selected from Group A of cross-linkable group (namely, groups represented by any of the formula (XL-1) to the formula (XL-19)) are preferred.

(Group A of Cross-Linkable Group)

[Chemical Formula 8]

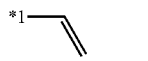 (XL-1)

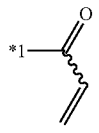 (XL-2)

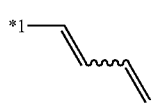 (XL-3)

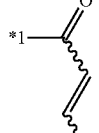 (XL-4)

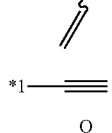 (XL-5)

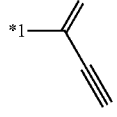 (XL-6)

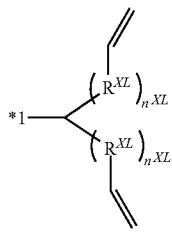 (XL-7)

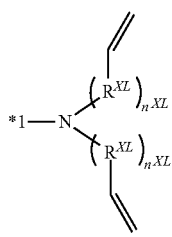 (XL-8)

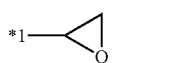 (XL-9)

 (XL-10)

 (XL-11)

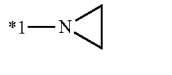 (XL-12)

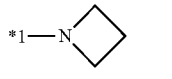 (XL-13)

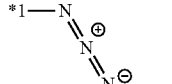 (XL-14)

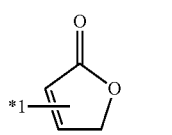 (XL-15)

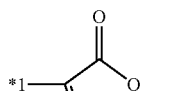 (XL-16)

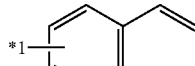 (XL-17)

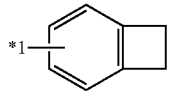 (XL-18)

-continued

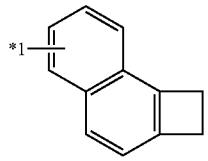

(XL-19)

[wherein, $R^{XL}$ represents a methylene group, an oxygen atom or a sulfur atom, and $n^{XL}$ represents an integer of 0 to 5. When a plurality of $R^{XL}$ are present, they may be the same or different. A plurality of $n^{XL}$ may be the same or different. *1 represents a binding position. These cross-linkable groups optionally have a substituent. When a plurality of the substituents are present, they may be the same or different and may be combined together to form a ring together with carbon atoms to which they are attached.]

"The substituent" includes, for example, a halogen atom, a cyano group, an alkyl group, a cycloalkyl group, an aryl group, a monovalent hetero ring group, an alkoxy group, a cycloalkoxy group, an aryloxy group, an amino group, a substituted amino group, an alkenyl group, a cycloalkenyl group, an alkynyl group and a cycloalkynyl group. The substituent may be a cross-linkable group. When a plurality of the substituents are present, they may be combined together to form a ring together with atoms to which they are attached, but it is preferable that they do not form a ring.

In the present specification, calculation of the value of the absolute value of a difference between the energy level of the lowest triplet excited state and the energy level of the lowest singlet excited state (hereinafter, referred to also as "$\Delta E_{ST}$") is carried out by the following method. First, the ground state of a compound is structurally optimized by density-functional approach at B3LYP level. In this procedure, 6-31G* is used as the basis function. Using the resultant structurally optimized structure, $\Delta E_{ST}$ of the compound is calculated by B3LYP level time-dependent density-functional approach. In the case of containing an atom to which 6-31G* cannot be applied, LANL2DZ is used for the atom. Calculation is performed using Gaussian09, as the quantum chemistry calculation program.

<Composition for Light Emitting Device>

The composition for light emitting device of the present embodiment contains a compound (A) represented by the formula (FR) and a compound (B) having a condensed hetero ring skeleton (b) containing a boron atom and a nitrogen atom in the ring.

In the composition for light emitting device of the present embodiment, the compound (A) and the compound (B) each may be contained singly or in combination of two or more.

In the composition for light emitting device of the present embodiment, the compound (A) is preferably a host material, and the compound (B) is preferably a guest material. In the present embodiment, the host material is a material interacting physically, chemically or electrically with the guest material. By this interaction, it becomes possible to improve or adjust, for example, the light emitting properties, the charge transportability or charge injectability of the composition for light emitting device of the present embodiment.

In the composition for light emitting device of the present embodiment, if a light emitting material is explained as an example, the host material and the guest material interact electrically to transfer efficiently electrical energy from the host material to the guest material, accordingly, the guest material can be allowed to emit light more efficiently, and the light emitting device of the present embodiment has more lowered driving voltage.

When the compound (B) is used as a light emitting material, the maximum peak wavelength of the emission spectrum at 25° C. of the compound (B) is preferably in the visible light region. In this case, the maximum peak wavelength of the emission spectrum at 25° C. of the compound (B) is preferably 380 nm or more, more preferably 400 nm or more, and further preferably 420 nm or more. The maximum peak wavelength of the emission spectrum at 25° C. of the compound (B) is preferably 750 nm or less, more preferably 620 nm or less, further preferably 570 nm or less, particularly preferably 495 nm or less, and especially preferably 480 nm or less.

Further, when the compound (B) is used as a light emitting material, the half-value width of the maximum peak of the emission spectrum at 25° C. of the compound (B) is preferably 50 nm or less, more preferably 40 nm or less, further preferably 30 nm or less, and Particularly preferably 25 nm or less.

The maximum peak wavelength of the emission spectrum at room temperature (25° C.) of a compound can be evaluated by dissolving the compound in an organic solvent such as xylene, toluene, chloroform, tetrahydrofuran and the like to prepare a dilute solution ($1\times10^{-6}$% by mass to $1\times10^{-3}$% by mass), and measuring the PL spectrum of the dilute solution at room temperature. The organic solvent for dissolving the compound is preferably xylene.

In the composition for light emitting device of the present embodiment, the content of the compound (B) is usually 0.001 to 99 parts by mass, when the sum of the compound (A) and the compound (B) is taken as 100 parts by mass, and it is preferably 0.005 to 70 parts by mass, more preferably 0.01 to 50 parts by mass, further preferably 0.05 to 30 parts by mass, particularly preferably 0.1 to 10 parts by mass, and especially preferably 0.5 to 5 parts by mass, since the light emitting device of the present embodiment has more lowered driving voltage.

In the composition for light emitting device of the present embodiment, the molecular weight (MA) of the compound (A) is preferably 200 or more, since the light emitting device of the present embodiment has more lowered driving voltage. It is guessed that when the molecular weight of the compound (A) is 200 or more, stability of the molecular weight (A) improves, and, oxidation, reduction, decomposition and the like of the compound (A) are suppressed, resultantly, an increase in the driving voltage of a light emitting device ascribable to oxidation, reduction, decomposition and the like of the compound (A) is suppressed.

Further, in the composition for light emitting device of the present embodiment, the molecular weight (MA) of the compound (A) is preferably 1500 or less, since the light emitting device of the present embodiment has more lowered driving voltage. It is supposed that when the molecular weight (MA) of the compound (A) is 1500 or less, uniformity of the compound (A) in the layer improves more in forming the organic layer, and an increase in the driving voltage of a light emitting device due to influences such as lowering of the film quality of the organic layer and the like is suppressed.

Based on the above idea, the molecular weight (MA) of the compound (A) is preferably 300 or more, more preferably 400 or more, and further preferably 500 or more, from the standpoint of more lowering the driving voltage of the light emitting device of the present embodiment. Meanwhile, the molecular weight (MA) is preferably 1000 or less, more preferably 800 or less, and further preferably 700 or less.

When the composition for light emitting device of the present embodiment contains two or more compounds (A), the molecular weight of at least one of the two or more compounds (A) contained in the composition for light emitting device of the present embodiment may satisfy MA, and from the standpoint of more lowering the driving voltage of the light emitting device of the present embodiment, it is preferable that the molecular weight of the compound (A) having the highest content among the two or more compounds (A) satisfies MA, it is more preferable that the weighted average of the molecular weights of the two or more compounds (A) satisfies MA, and it is further preferable that all the molecular weights of the two or more compounds (A) satisfy MA.

In the composition for light emitting device of the present embodiment, the molecular weight (MB) of the compound (B) is preferably 200 or more, since the light emitting device of the present embodiment has more lowered driving voltage. It is supposed that when the molecular weight of the compound (B) is 200 or more, stability the molecular weight (B) improves, and, oxidation, reduction, decomposition and the like of the compound (B) are suppressed, accordingly, an increase in the driving voltage of a light emitting device ascribable to oxidation, reduction, decomposition and the like of the compound (B) is suppressed.

Further, in the composition for light emitting device of the present embodiment, the molecular weight (MB) of the compound (B) is preferably 1500 or less, since the light emitting device of the present embodiment has more lowered driving voltage. It is supposed that when the molecular weight (MB) of the compound (B) is 1500 or less, uniformity of the compound (B) in the layer improves more in forming the organic layer, and resultantly, an increase in the driving voltage of a light emitting device due to influences such as lowering of the film quality of the organic layer and the like is suppressed.

Based on the above idea, the molecular weight (MB) is preferably 300 or more, more preferably 350 or more, and further preferably 400 or more, from the standpoint of more lowering the driving voltage of the light emitting device of the present embodiment. Meanwhile, the molecular weight (MB) is preferably 1350 or less, more preferably 1200 or less, and further preferably 1150 or less.

When the composition for light emitting device of the present embodiment contains two or more compounds (B), the molecular weight of at least one of the two or more compounds (B) contained in the composition for light emitting device of the present embodiment ay satisfy MB, and from the standpoint of more lowering the driving voltage of the light emitting device of the present embodiment, it is preferable that the molecular weight of the compound (B) having the highest content among the two or more compounds (B) satisfies MB, it is more preferable that the weighted average of the molecular weights of the two or more compounds (B) satisfies MB, and it is further preferable that all the molecular weights of the two or more compounds (B) satisfy MB.

In the composition for light emitting device of the present embodiment, the molecular weight (MA) of the compound (A) and the molecular weight (MB) of the compound (B) satisfy the formula (M1-1) and the formula (M2-1).

$$400 \leq MA+MB \leq 2000 \quad (M1\text{-}1)$$

$$0.30 \leq MA/(MA+MB) \leq 0.70 \quad (M2\text{-}1)$$

That is, in the composition for light emitting device of the present embodiment, the value of MA+MB (the total value of MA and MB) is 400 or more and 2000 or less. It is supposed that if the value of MA+MB is less than 400, stability the compound (A) and/or the compound (B) lowers, and problems such oxidation, reduction, decomposition and the like tend to occur, and there is a possibility of an increase in the driving voltage of a light emitting device because of these problems. Meanwhile, it is supposed that if the value of MA+MB is over 2000, problems such as uneven distribution of the compound in an organic layer, lowering of the film quality and the like tend to occur due to a decrease in compatibility or a decrease in uniformity in an layer, and there is a possibility of an increase in the driving voltage of a light emitting device because of these problems Based on the above idea, the value of MA+MB is preferably 500 or more, more preferably 650 or more, further preferably 800 or more, and particularly preferably 900 or more, from the standpoint of more lowering the driving voltage of the light emitting device of the present embodiment. Meanwhile, the value of MA+MB is preferably 1900 or less, more preferably 1850 or less, further preferably 1800 or less, and particularly preferably 1750 or less.

Further, in the composition for light emitting device of the present embodiment, the value of MA/(MA+MB) (the ratio of the molecular weight of the compound (A) with respect to the sum of the molecular weight of the compound (A) and the molecular weight of the compound (B)) is 0.30 or more and 0.70 or less. It is supposed that when the value of MA/(MA+MB) is less than 0.30, a difference in the molecular weight between the compound (MA) and the compound (MB) increases, and problems such as uneven distribution of the compound in an organic layer, lowering of the film quality and the like tend to occur due to a decrease in compatibility or a decrease in uniformity in a layer, and there is a possibility of an increase in the driving voltage of a light emitting device because of the problems. Meanwhile, it is supposed that when the value of MA/(MA+MB) is over 0.70, a difference in the molecular weight between the compound (MA) and the compound (MB) increases, and problems such as uneven distribution of the compound in an organic layer, lowering of the film quality and the like tend to occur due to a decrease in compatibility or a decrease in uniformity in a layer, and there is a possibility of an increase in the driving voltage of a light emitting device because of the problems.

Based on the above idea, the value of MA/(MA+MB) is preferably 0.30 or more and 0.65 or less, and more preferably 0.30 or more and 0.60 or less, from the standpoint of more lowering the driving voltage of the light emitting device of the present embodiment.

A light emitting device having low driving voltage can be realized by selecting the compound (A) and the compound (B) so that the value of MA+MB and the value of MA/(MA+MB) are in specific ranges, in the composition for light emitting device of the present embodiment.

[Compound (A)]

The compound (A) is a compound represented by the formula (FH). The compound (A) is a compound different from the compound (B), and is a compound having no condensed hetero ring skeleton (b).

$n^{1H}$ is usually an integer of 10 or less, and it is preferably an integer of 7 or less, more preferably an integer of 5 or less, and further preferably an integer of 3 or less, since synthesis of the compound represented by the formula (FH) is easy. Meanwhile, $n^{1H}$ is preferably an integer of 1 or more, and more preferably an integer of 2 or more, since the light emitting device of the present embodiment has more lowered driving voltage.

$Ar^{1H}$ includes, for example, groups obtained by removing from a monocyclic aromatic hydrocarbon $n^{1H}$ or more hydrogen atoms bonding directly to atoms constituting the ring (hereinafter, referred to also as "monocyclic aromatic hydrocarbon group") and groups obtained by removing from a polycyclic aromatic hydrocarbon $n^{1H}$ or more hydrogen atoms bonding directly to atoms constituting the ring (hereinafter, referred to also as "polycyclic aromatic hydrocarbon group"), and it is preferably a polycyclic aromatic hydrocarbon group, since the light emitting device of the present embodiment has more lowered driving voltage, and these groups optionally have a substituent.

The aromatic hydrocarbon represented by $Ar^{1H}$ includes, for example, aromatic hydrocarbons explained in the section of the aromatic hydrocarbon group described above.

The number of carbon atoms of the monocyclic aromatic hydrocarbon group represented by $Ar^{1H}$, not including the number of carbon atoms of the substituent, is preferably 6. The monocyclic aromatic hydrocarbon in the monocyclic aromatic hydrocarbon group represented by $Ar^{1H}$ is preferably benzene, since the light emitting device of the present embodiment has more lowered driving voltage.

The number of carbon atoms of the polycyclic aromatic hydrocarbon group represented by $Ar^{1H}$, not including the number of carbon atoms of the substituent, is usually 7 to 60, preferably 8 to 40, more preferably 10 to 30, and further preferably 12 to 20. The polycyclic aromatic hydrocarbon in the polycyclic aromatic hydrocarbon group represented by $Ar^{1H}$ is preferably a dicyclic to heptacyclic aromatic hydrocarbon, more preferably a tri to pentacyclic aromatic hydrocarbon, further preferably anthracene, phenanthrene, fluorene, benzoanthracene, benzophenanthrene, benzofluorene, pyrene, fluoranthene, perylene or benzofluoranthene, and particularly preferably anthracene, fluorene, benzoanthracene, benzofluorene, fluoranthene or benzofluoranthene, since the light emitting device of the present embodiment has more lowered driving voltage.

The substituent which $Ar^{1H}$ optionally has includes, for example, substituents other than the aryl group, the monovalent hetero ring group and the substituted amino group, and is preferably a halogen atom, a cyano group, an alkyl group, a cycloalkyl group, an alkoxy group, a cycloalkoxy group, an alkenyl group or a cycloalkenyl group, more preferably an alkyl group, a cycloalkyl group, an alkoxy group or a cycloalkoxy group, and further preferably an alkyl group or a cycloalkyl group, and these groups optionally further have a substituent.

The examples and preferable ranges of the substituent which the substituent which $Ar^{1H}$ optionally has optionally further has are the same as the examples and preferable ranges of the substituent which the substituent which $R^{1H}$ optionally has optionally further has described later.

$R^{1H}$ is preferably an aryl group or a monovalent hetero ring group, and more preferably an aryl group, since the light emitting device of the present embodiment has more lowered driving voltage, and these groups optionally have a substituent.

The aryl group represented by $R^{1H}$ is preferably a group obtained by removing from a monocyclic or dicyclic to hexacyclic aromatic hydrocarbon one hydrogen atom bonding directly to an atom constituting the ring, more preferably a group obtained by removing from a monocyclic or dicyclic to tetracyclic aromatic hydrocarbon one hydrogen atom bonding directly to an atom constituting the ring, further preferably a group obtained by removing from benzene, naphthalene, dihydrophenanthrene, fluorene or benzofluorene one hydrogen atom bonding directly to an atom constituting the ring, and particularly preferably a phenyl group or a naphthyl group, and these groups optionally have a substituent.

In the monovalent hetero ring group represented by $R^{1H}$, the heterocyclic compound containing no condensed hetero ring skeleton (b) includes heterocyclic compounds not containing a boron atom and a nitrogen atom in the ring among heterocyclic compounds explained in the section of the hetero ring group described above. The monovalent hetero ring group represented by $R^1H$ is preferably a group obtained by removing from a monocyclic or dicyclic to hexacyclic heterocyclic compound containing no condensed hetero ring skeleton (b) one hydrogen atom bonding directly to an atom constituting the ring, more preferably a group obtained by removing from a monocyclic or dicyclic to tetracyclic heterocyclic compound containing no condensed hetero ring skeleton (b) one hydrogen atom bonding directly to an atom constituting the ring, and more preferably a group obtained by removing from pyridine, diazabenzene, triazine, azanaphthalene, diazanaphthalene, dibenzofuran, dibenzothiophene, carbazole, benzocarbazole, benzonaphthofuran or benzonaphthothiophene one hydrogen atom bonding directly to an atom constituting the ring, and these groups optionally have a substituent.

In the substituted amino group represented by $R^{1H}$, the substituent which the amino group has is preferably an aryl group or a monovalent hetero ring group, and more preferably an aryl group, and these groups optionally further have a substituent. The examples and preferable ranges of the aryl group as the substituent which the amino group has are the same as the examples and preferable ranges of the aryl group represented by $R^{1H}$. The examples and preferable ranges of the monovalent hetero ring group as the substituent which the amino group has are the same as the examples and preferable ranges of the monovalent hetero ring group represented by $R^{1H}$.

The substituent which $R^{1H}$ optionally has is preferably a halogen atom, a cyano group, an alkyl group, a cycloalkyl group, an alkoxy group, a cycloalkoxy group, an aryl group, a monovalent hetero ring group or a substituted amino group, more preferably an alkyl group, a cycloalkyl group, an aryl group, a monovalent hetero ring group or a substituted amino group, and further preferably an alkyl group, a cycloalkyl group or an aryl group, and these groups optionally further have a substituent.

The examples and preferable ranges of the aryl group, the monovalent hetero ring group and the substituted amino group as the substituent which optionally has are the same as the examples and preferable ranges of the aryl group, the monovalent hetero ring group and the substituted amino group represented by $R^{1H}$.

The substituent which the substituent which $R^{1H}$ optionally has optionally further has is preferably a halogen atom, a cyano group, an alkyl group, a cycloalkyl group, an alkoxy group, a cycloalkoxy group, an aryl group, a monovalent hetero ring group or a substituted amino group, more preferably an alkyl group, a cycloalkyl group, an aryl group, a monovalent hetero ring group or a substituted amino group, and further preferably an alkyl group or a cycloalkyl group, and these groups optionally further have a substituent, but it is preferable that they do not further have a substituent.

The examples and preferable ranges of the aryl group, the monovalent hetero ring group and the substituted amino group as the substituent which the substituent which $R^{1H}$ optionally has optionally further has are the same as the examples and preferable ranges of the aryl group, the monovalent hetero ring group and the substituted amino group represented by $R^{1H}$.
As the compound (A), compounds represented by the following formulae are exemplified.
[Chemical Formula 9]
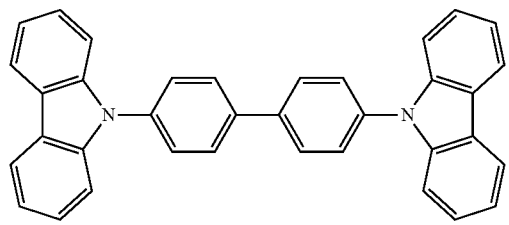
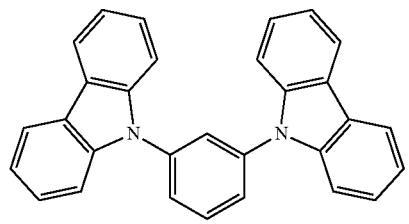
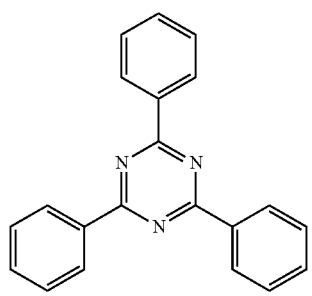
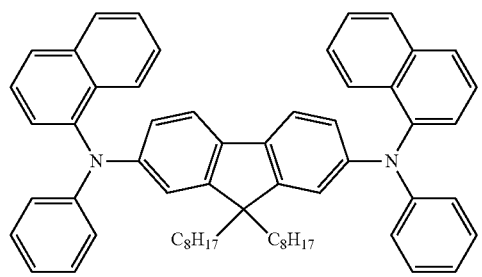
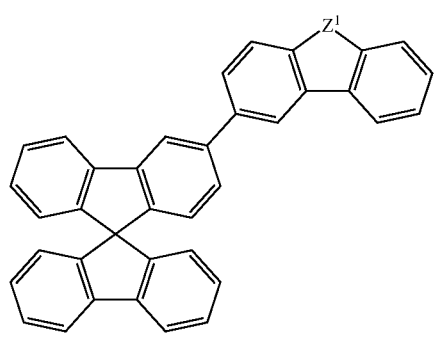
[Chemical Formula 10]
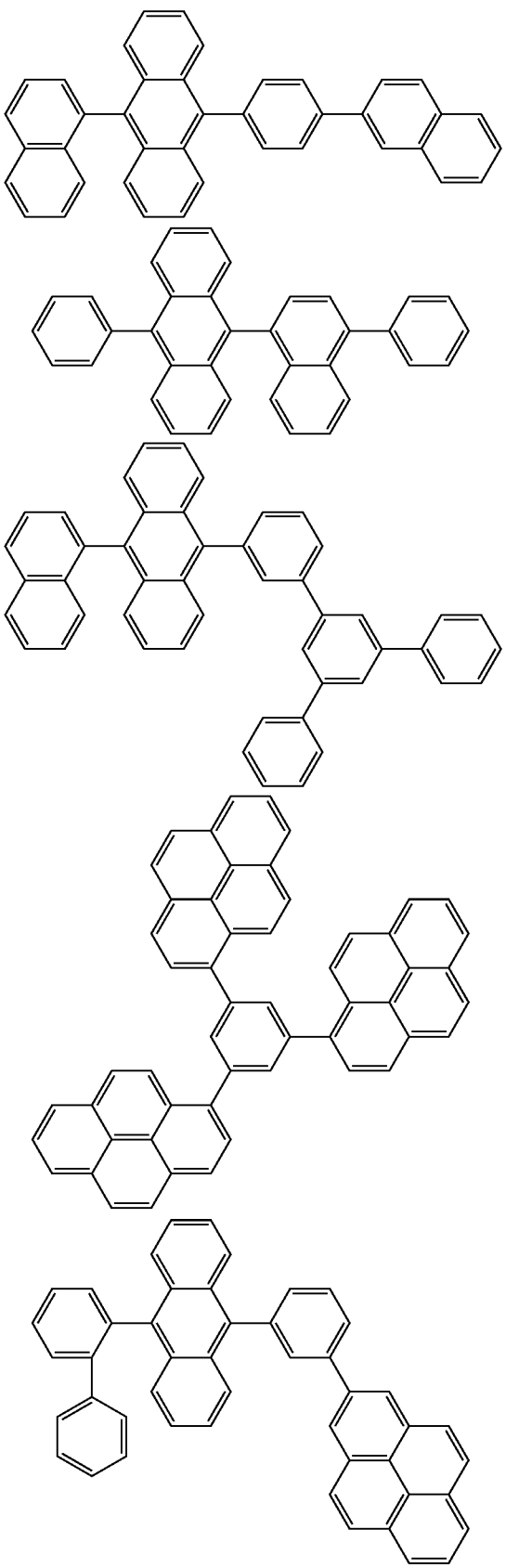

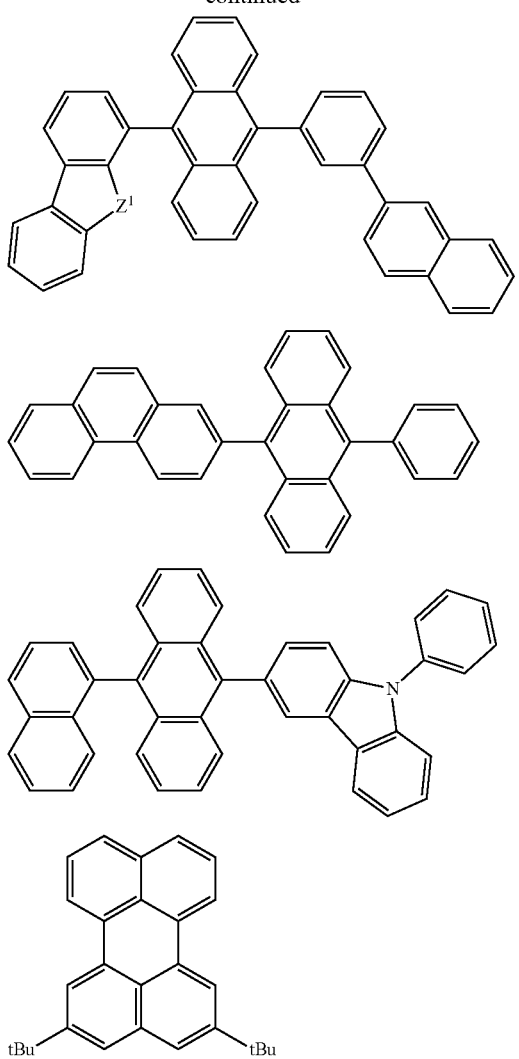
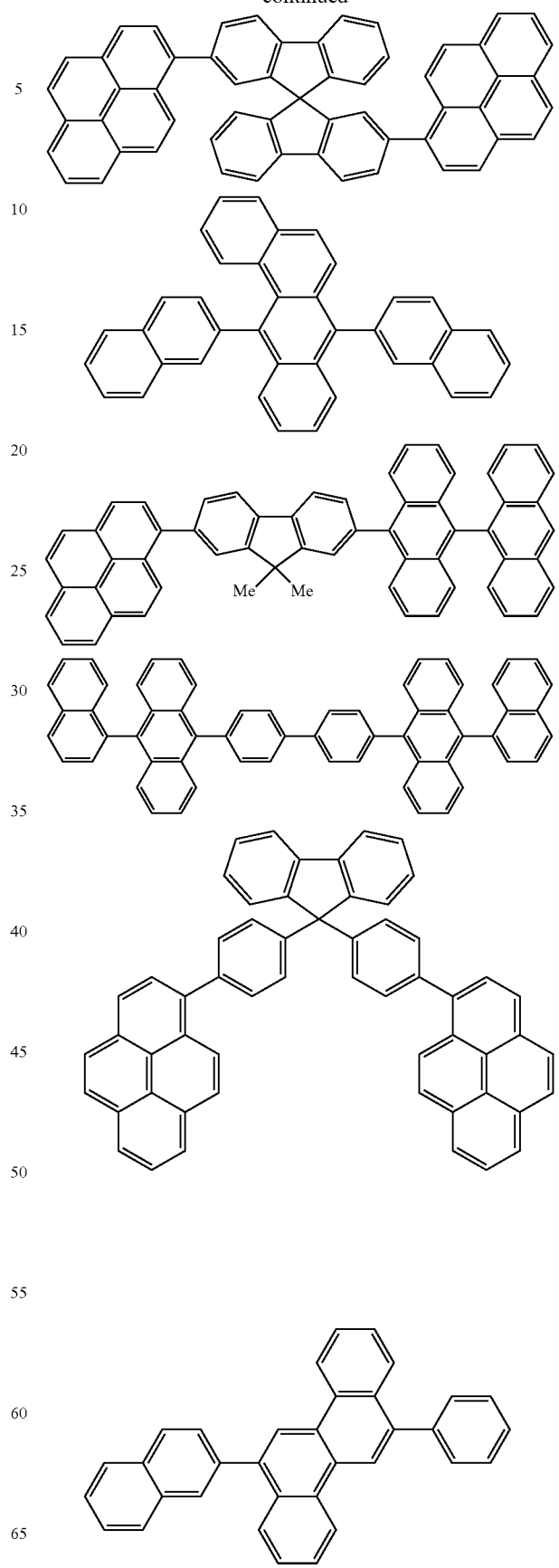

[Chemical Formula 12]

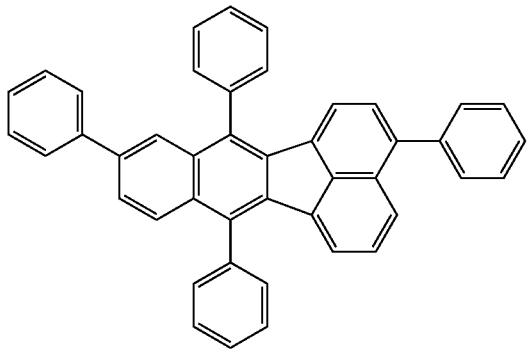

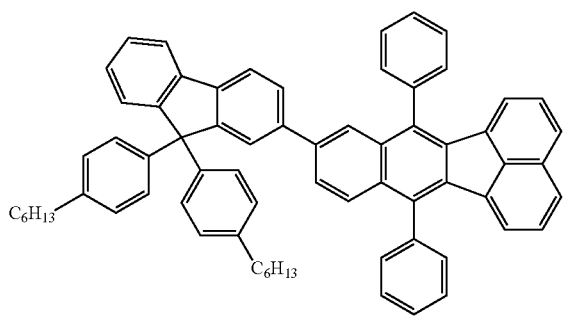

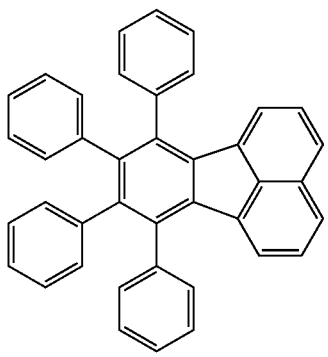

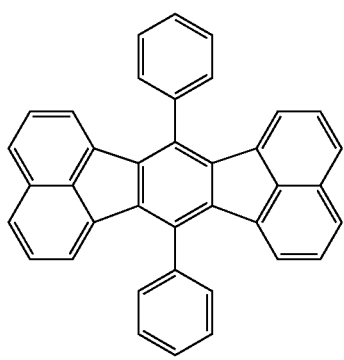

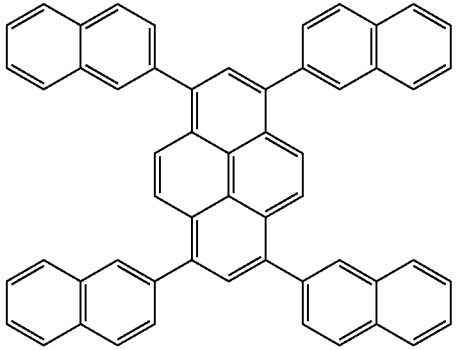

In the formulae, $Z^1$ represents an oxygen atom or a sulfur atom.

[Compound (B)]

The compound (B) is a compound having a condensed hetero ring skeleton (b) containing a boron atom and a nitrogen atom in the ring.

In the compound (B), it is preferable that at least one of nitrogen atoms contained in the condensed hetero ring skeleton (b) is a nitrogen atom not forming a double bond, and it is more preferable that all nitrogen atoms contained in the condensed hetero ring skeleton (b) are nitrogen atoms not forming a double bond.

The number of carbon atoms of the condensed hetero ring skeleton (b), not including the number of carbon atoms of the substituent, is usually 1 to 60, preferably 5 to 40, and more preferably 10 to 25.

The number of hetero atoms of the condensed hetero ring skeleton (b), not including the number of hetero atoms of the substituent, is usually 2 to 30, preferably 2 to 15, more preferably 2 to 10, further preferably 2 to 5, and particularly preferably 2 or 3.

The number of born atoms of the condensed hetero ring skeleton (b), not including the number of boron atoms of the substituent, is usually 1 to 10, preferably 1 to 5, more preferably 1 to 3, and further preferably 1.

The number of nitrogen atoms of the condensed hetero ring skeleton (b), not including the number of nitrogen atoms of the substituent, is usually 1 to 20, preferably 1 to 10, more preferably 1 to 5, further preferably 1 to 3, and particularly preferably 2.

The condensed hetero ring skeleton (b) is preferably a tri to dodecacyclic condensed hetero ring skeleton, more preferably a tri to hexacyclic condensed hetero ring skeleton, and further preferably a pentacyclic condensed hetero ring skeleton, since the light emitting device of the present embodiment has more lowered driving voltage.

The compound (B) can also be referred to as a compound having a hetero ring group (b') containing a condensed hetero ring skeleton (b).

The hetero ring group (b') may be a group obtained by removing from a polycyclic heterocyclic compound containing a boron atom and a nitrogen atom in the ring one or more hydrogen atoms bonding directly to atoms constituting the ring, and the group optionally has a substituent.

The substituent which the hetero ring group (b') optionally has is preferably a halogen atom, a cyano group, an alkyl group, a cycloalkyl group, an alkoxy group, a cycloalkoxy group, an aryl group, a monovalent hetero ring group or a substituted amino group, more preferably an alkyl group, a cycloalkyl group, an alkoxy group, a cycloalkoxy group, an aryl group, a monovalent hetero ring group or a substituted amino group, and further preferably an alkyl group, an aryl group or a substituted amino group, and these groups optionally further have a substituent.

The aryl group as the substituent which the hetero ring group (b') optionally has is preferably a group obtained by removing from a monocyclic or dicyclic to hexacyclic aromatic hydrocarbon one hydrogen atom bonding directly to an atom constituting the ring, more preferably a group obtained by removing from a monocyclic, dicyclic or tricyclic aromatic hydrocarbon one hydrogen atom bonding directly to an atom constituting the ring, further preferably a group obtained by removing from benzene, naphthalene, anthracene, phenanthrene or fluorene one hydrogen atom bonding directly to an atom constituting the ring, and particularly preferably a phenyl group, and these groups optionally have a substituent.

The monovalent hetero ring group as the substituent which the hetero ring group (b') optionally has is preferably a group obtained by removing from a monocyclic or dicyclic to hexacyclic heterocyclic compound one hydrogen atom bonding directly to an atom constituting the ring, more preferably a group obtained by removing from a monocyclic, dicyclic or tricyclic heterocyclic compound one hydrogen atom bonding directly to an atom constituting the ring, further preferably a group obtained by removing from pyridine, diazabenzene, triazine, azanaphthalene, diazanaphthalene, carbazole, dibenzofuran, dibenzothiophene, phenoxazine or phenothiazine one hydrogen atom bonding directly to an atom constituting the ring, and particularly preferably a group obtained by removing from pyridine, diazabenzene or triazine one hydrogen atom bonding directly to an atom constituting the ring, and these groups optionally have a substituent.

In the substituted amino group as the substituent which the hetero ring group (b') optionally has, the substituent which the amino group has is preferably an aryl group or a monovalent hetero ring group, and more preferably an aryl group, and these groups optionally further have a substituent. The examples and preferable ranges of the aryl group and the monovalent hetero ring group as the substituent which the amino group has are the same as the examples and preferable ranges of the aryl group and the monovalent hetero ring group as the substituent which the hetero ring group (b') optionally has, respectively.

The substituent which the substituent which the hetero ring group (b') optionally has optionally further has is preferably a halogen atom, an alkyl group, a cycloalkyl group, an alkoxy group, a cycloalkoxy group, an aryl group, a monovalent hetero ring group or a substituted amino group, more preferably an alkyl group, a cycloalkyl group, an aryl group, a monovalent hetero ring group or a substituted amino group, and further preferably an alkyl group or a cycloalkyl group, and these groups optionally further have a substituent, but it is preferable that they do not further have a substituent.

The examples and preferable ranges of the aryl group, the monovalent hetero ring group and the substituted amino group as the substituent which the substituent which the hetero ring group (b') optionally has optionally further has are the same as the examples and preferable ranges of the aryl group, the monovalent hetero ring group and the substituted amino group as the substituent which the hetero ring group (b') optionally has, respectively.

"The nitrogen atom not forming a double bond" means a nitrogen atom that is single-bonded to each of the other three atoms.

The phrase "containing a nitrogen atom not forming a double bond in the ring" means that a group represented by —N(—$R^N$)— (wherein, $R^N$ represents a hydrogen atom or a substituent) or the formula:

[Chemical Formula 13]

is contained in the ring.

The compound (B) is preferably a thermally activated delayed fluorescence (TADF) compound, since the light emitting device of the present embodiment has more lowered driving voltage.

$\Delta E^{ST}$ of the compound (B) is preferably 0.50 eV or less, since the light emitting device of the present embodiment has more lowered driving voltage. Meanwhile, $\Delta E^{ST}$ of the compound (B) may be 0.001 eV or more, may be 0.01 eV or more, may be 0.10 eV or more, may be 0.20 eV or more, may be 0.30 eV or more, or may be 0.40 eV or more.

The compound (B) is preferably a compound represented by the formula (1-1), the formula (1-2) or the formula (1-3), more preferably a compound represented by the formula (1-2) or the formula (1-3), and further preferably a compound represented by the formula (1-2), since the light emitting device of the present embodiment has more lowered driving voltage.

$Ar^1$, $Ar^2$ and $Ar^3$ are each preferably a group obtained by removing from a monocyclic, dicyclic or tricyclic aromatic hydrocarbon or a monocyclic, dicyclic or tricyclic heterocyclic compound one or more hydrogen atoms bonding directly to atoms constituting the ring, more preferably a group obtained by removing from a monocyclic aromatic hydrocarbon or a monocyclic heterocyclic compound one or more hydrogen atoms bonding directly to atoms constituting the ring, further preferably a group obtained by removing from benzene, pyridine or diazabenzene one or more hydrogen atoms bonding directly to atoms constituting the ring, and particularly preferably a group obtained by removing from benzene one or more hydrogen atoms bonding directly to atoms constituting the ring, since the light emitting device of the present embodiment has more lowered driving voltage, and these groups optionally have a substituent.

The examples and preferable ranges of the substituent which $Ar^1$, $Ar^2$ and $Ar^3$ optionally have are the same as the examples and preferable ranges of the substituent which the hetero ring group (b') optionally has.

$Y^2$ and $Y^3$ are each preferably a single bond, an oxygen atom, a sulfur atom, a group represented by —N(Ry)- or a methylene group, more preferably a single bond, an oxygen atom, a sulfur atom or a group represented by —N(Ry)-, further preferably an oxygen atom, a sulfur atom or a group represented by —N(Ry)-, particularly preferably a group represented by —N(Ry)-, and these groups optionally have a substituent.

The examples and preferable ranges of the substituent which $Y^1$, $Y^2$ and $Y^3$ optionally have are the same as the examples and preferable ranges of the substituent which the hetero ring group (b') optionally has.

Ry is preferably an alkyl group, a cycloalkyl group, an aryl group or a monovalent hetero ring group, more preferably an aryl group or a monovalent hetero ring group, and further preferably an aryl group, and these groups optionally have a substituent.

The examples and preferable ranges of the aryl group and the monovalent hetero ring group represented by Ry are the same as the examples and preferable ranges of the aryl group and the monovalent hetero ring group as the substituent which the hetero ring group (b') optionally has, respectively.

The examples and preferable ranges of the substituent which Ry optionally has are the same as the examples and preferable ranges of the substituent which the hetero ring group (b') optionally has.

Ry may be bonded directly or via a connecting group to $Ar^1$, $Ar^2$ or $Ar^3$, but it is preferable that it is not bonded. The connecting group includes, for example, a group represented by —O—, a group represented by —S—, a group represented by —N(Ry)-, an alkylene group, a cycloalkylene group, an arylene group and a divalent hetero ring group, and is preferably a group represented by —O—, a group represented by —S—, a group represented by —N(Ry)- or a methylene group, and these groups optionally have a substituent.

As the compound (B), compounds represented by the following formulae are exemplified.

[Chemical Formula 14]

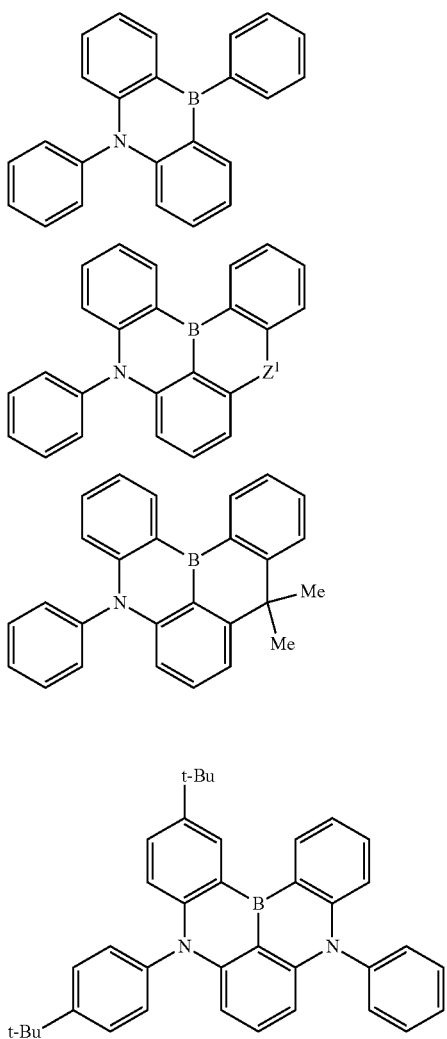

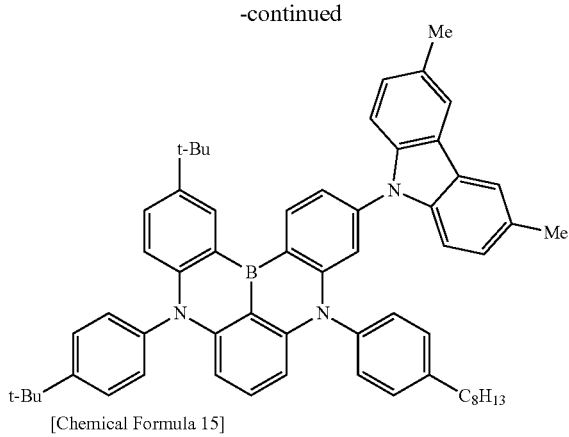

[Chemical Formula 15]

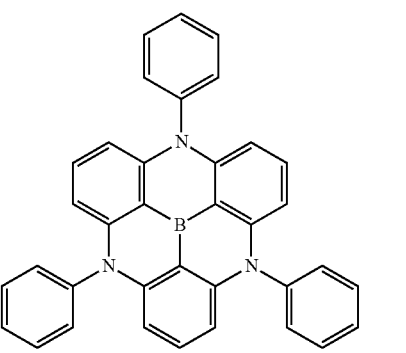

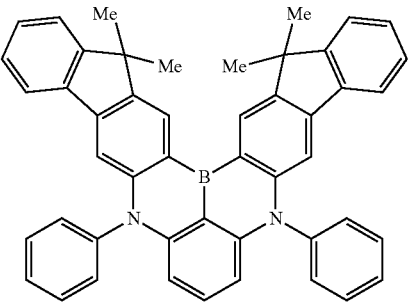

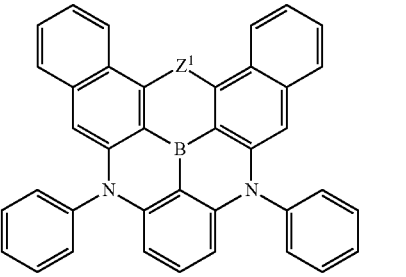

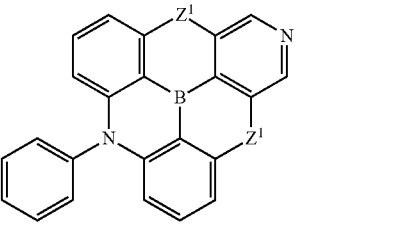

In the formulae, $Z^1$ represents an oxygen atom or a sulfur atom.

[Other Components]

The composition for light emitting device of the present embodiment may be a composition containing the compound (A), the compound (B), and at least one selected from the group consisting of a hole transporting material, a hole injection material, an electron transporting material, an electron injection material, a light emitting material, an antioxidant and a solvent. The hole transporting material, the hole injection material, the electron transporting material, the electron injection material and the light emitting material are different from the compound (A) and the compound (B).

[Ink]

The composition containing the compound (A), the compound (B) and a solvent (hereinafter, referred to as "ink") is suitable for fabricating a light emitting device using a wet method such as, for example, a spin coat method, a casting method, a microgravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like. The viscosity of the ink may be adjusted according to the type of the printing method, and is preferably 1 mPa·s to 20 mPa·s at 25° C.

The solvent contained in the ink is preferably a solvent capable of dissolving or uniformly dispersing solid components in the ink. The solvent includes, for example, chlorine-based solvents, ether-based solvents, aromatic hydrocarbon-based solvents, aliphatic hydrocarbon-based solvents, ketone-based solvents, ester-based solvents, polyhydric alcohol-based solvents, alcohol-based solvents, sulfoxide-based solvents and amide-based solvents.

In the ink, the compounding amount of the solvent is usually 1000 parts by mass to 100000 parts by mass, when the sum of the compound (A) and the compound (B) is taken as 100 parts by mass.

The solvent may be used singly or in combination of two or more.

Hole Transporting Material

The hole transporting material is classified into low molecular weight compounds and polymer compounds, and polymer compounds having a cross-linkable group are preferable.

The polymer compound includes, for example, polyvinylcarbazole and derivatives thereof; and polyarylenes having an aromatic amine structure in the side chain or main chain, and derivatives thereof. The polymer compound may be a compound to which an electron accepting site such as fullerene, tetrafluorotetracyanoquinodimethane, tetracyanoethylene, trinitrofluorenone and the like is bonded.

In the composition for light emitting device of the present embodiment, when a hole transporting material is contained, the compounding amount of the hole transporting material is usually 1 part by mass to 1000 parts by mass, when the sum of the compound (A) and the compound (B) is taken as 100 parts by mass.

The hole transporting material may be used singly or in combination of two or more.

Electron Transporting Material

The electron transporting material is classified into low molecular weight compounds and polymer compounds. The electron transporting material may have a cross-linkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

In the composition for light emitting device of the present embodiment, when an electron transporting material is contained, the compounding amount of the electron transporting material is usually 1 part by mass to 1000 parts by mass, when the sum of the compound (A) and the compound (B) is taken as 100 parts by mass.

The electron transporting material may be used singly or in combination of two or more.

Hole Injection Material and Electron Injection Material

The hole injection material and the electron injection material are each classified into low molecular weight compounds and polymer compounds. The hole injection material and the electron injection material may have a cross-linkable group.

The low molecular weight compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes electrically conductive polymers such as, for example, polyaniline, polythiophene, polypyrrole, polyphenylenevinylene, polythienylenevinylene, polyquinoline and polyquinoxaline, and derivatives thereof; a polymer containing an aromatic amine structure in the main chain or side chain, and the like.

In the composition for light emitting device of the present embodiment, when a hole injection material and/or an electron injection material is contained, the compounding amounts of the hole injection material and the electron injection material are each usually 1 part by mass to 1000 parts by mass, when the sum of the compound (A) and the compound (B) is taken as 100 parts by mass.

The hole injection material and the electron injection material each may be used singly or in combination of two or more.

Ion Doping

When the hole injection material or the electron injection material contains an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with an appropriate amount of ions. The kind of the ion to be doped an anion for the hole injection material and a cation for the electron injection material. The anion includes, for example, a polystyrenesulfonic ion, an alkylbenzenesulfonic ion and a camphorsulfonic ion. The cation includes, for example, a lithium ion, a sodium ion, a potassium ion and a tetrabutylammonium ion.

The ion to be doped may be used singly or in combination of two or more.

Light Emitting Material

The light emitting material is classified into low molecular weight compounds and polymer compounds. The light emitting material may have a cross-linkable group.

The low molecular weight compound includes, for example, naphthalene and derivatives thereof, anthracene and derivatives thereof, perylene and derivatives thereof, and triplet light emitting complexes having iridium, platinum or europium as the central metal.

The polymer compound includes polymer compounds containing, for example, an arylene group such as a phenylene group, a naphthalenediyl group, a fluorenediyl group, a phenanthrenediyl group, a dihydrophenanthrenediyl group, an anthracenediyl group, a pyrenediyl group and the like; an aromatic amine residue such as a group obtained by removing from an aromatic amine two hydrogen atoms, and the like; and a divalent hetero ring group such as a carbazolediyl group, a phenoxazinediyl group, a phenothiazinediyl group and the like.

In the composition for light emitting device of the present embodiment, when a light emitting material is contained, the content of the light emitting material is usually 1 part by mass to 1000 parts by mass, when the sum of the compound (A) and the compound (B) is taken as 100 parts by mass.

The light emitting material may be used singly or in combination of two or more.

Antioxidant

The antioxidant may be a compound which is soluble in the same solvent as for the compound (A) and the compound (B) and does not inhibit light emission and charge transportation, and includes, for example, phenol type antioxidants and phosphorus-based antioxidants.

In the composition for light emitting device of the present embodiment, when an antioxidant is contained, the compounding amount of the antioxidant is usually 0.001 parts by mass to 10 parts by mass, when the sum of the compound (A) and the compound (B) is taken as 100 parts by mass.

The antioxidant may be used singly or in combination of two or more.

<Film>

The film of the present embodiment contains the composition for light emitting device described above. The film of the present embodiment is suitable as a light emitting layer in a light emitting device. The film of the present embodiment can be fabricated, for example, by a wet method using an ink. Further, the film of the present embodiment can be fabricated, for example, by a dry method such as a vacuum vapor deposition method and the like. The method for fabricating the film of the present embodiment by a dry method includes, for example, a method of vapor-depositing the above-described composition for light emitting device and a method of co-vapor-depositing the compound (A) and the compound (B).

The thickness of the film is usually 1 nm to 10 μm.

<Light Emitting Device>

The light emitting device of the present embodiment contains the composition for light emitting device described above.

The light emitting device of the present embodiment may be one having, for example, an anode, a cathode, and an organic layer disposed between the anode and the cathode and containing the composition for light emitting device described above.

[Layer Constitution]

The layer containing the composition for light emitting device of the present embodiment is usually one or more layers selected from the group consisting of a light emitting layer, a hole transporting layer, a hole injection layer, an electron transporting layer and an electron injection layer, and preferably is a light emitting layer. These layers contain a light emitting material, a hole transporting material, a hole injection material, an electron transporting material and an electron injection material, respectively. These layers can be formed by the same method as for the fabrication of the film described above using a light emitting material, a hole transporting material, a hole injection material, an electron transporting material and an electron injection material, respectively.

The light emitting device has a light emitting layer between an anode and a cathode. The light emitting device of the present embodiment preferably has at least one of a hole injection layer and a hole transporting layer between an anode and a light emitting layer, from the standpoint of hole injectability and hole transportability, and preferably has at least one of an electron injection layer and an electron transporting layer between a cathode and a light emitting layer, from the standpoint of electron injectability and electron transportability.

The materials of a hole transporting layer, an electron transporting layer, a light emitting layer, a hole injection layer and an electron injection layer include the hole transporting material, the electron transporting material, the light emitting material, the hole injection material and the electron injection material and the like described above, respectively, in addition to the composition for light emitting device of the present embodiment.

When the material of a hole transporting layer, the material of an electron transporting layer and the material of a light emitting layer are soluble in a solvent used in forming layers adjacent to the hole transporting layer, the electron transporting layer and the light emitting layer, respectively, in fabricating a light emitting device, it is preferable that the material has a cross-linkable group for avoiding the material from being dissolved in the solvent. After forming each layer using the material having a cross-linkable group, the cross-linkable group can be cross-linked to insolubilize the layer.

The method for forming each layer such as a light emitting layer, a hole transporting layer, an electron transporting layer, a hole injection layer, an electron injection layer and the like in the light emitting device of the present invention includes, for example, dry methods such as a method of vacuum vapor-deposition from a powder and the like and wet methods such as a method by film formation from a solution or melted state and the like when a low molecular weight compound is used, and includes, for example, wet methods such as a method by film formation from a solution or melted state and the like when a polymer compound is used. The order, number and thickness of layers to be laminated are adjusted in consideration of, for example, light emission efficiency, driving voltage and luminance life.

[Substrate/Electrode]

The substrate of a light emitting device may be a substrate on which an electrode can be formed and which does not chemically change in forming an organic layer, and it is, for example, a substrate made of a material such as glass, plastic, silicon and the like. In the case of an opaque substrate, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of one or more of them and one or more of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode each may take a laminated structure composed of two or more layers.

[Application]

The light emitting device of the present embodiment can be suitably used as a light source for backlight of a liquid crystal display device, a light source for illumination, organic EL illumination, a display device of computers, televisions, portable terminals and the like (for example, organic EL display and organic EL television).

Suitable embodiments of the present invention have been explained above, but the present invention is not limited to them.

For example, one aspect of the present invention may relate to the method for producing a composition for light emitting device described above.

In one embodiment, the production method of a composition for light emitting device may be a method for producing a composition for light emitting device comprising a preparation step of preparing one of the compound (A) and the compound (B), a sorting step of sorting the other of the compound (A) and the compound (B) so that the molecular weight (MA) of the compound (A) and the molecular weight (MB) of the compound (B) satisfy the formula (M1-1) and the formula (M2-1), and a composition production step of mixing the compound prepared in the preparation step and the compound sorted in the sorting step to obtain a composition for light emitting device (hereinafter, referred to also as "the production method of a composition for light emitting device of the present embodiment").

The production method of a composition for light emitting device of the present embodiment may be a method for producing a composition for light emitting device comprising a compound (A) preparation step of preparing the compound (A), a compound (B) sorting step of sorting the compound (B) so that the molecular weight (MA) of the compound (A) and the molecular weight (MB) of the compound (B) satisfy the formula (M1-1) and the formula (M2-1), and a composition production step of mixing the compound (A) prepared in the compound (A) preparation step and the compound (B) sorted in the compound (B) sorting step to obtain a composition for light emitting device (hereinafter, referred to also as "production method (1)").

Further, the production method of a composition for light emitting device of the present embodiment may be a method for producing a composition for light emitting device comprising a compound (B) preparation step of preparing the compound (B), a compound (A) sorting step of sorting the compound (A) so that the molecular weight (MA) of the compound (A) and the molecular weight (MB) of the compound (B) satisfy the formula (M1-1) and the formula (M2-1), and a composition production step of mixing the compound (B) prepared in the compound (B) preparation step and the compound (A) sorted in the compound (A) sorting step to obtain a composition for light emitting device (hereinafter, referred to also as "production method (2)").

The production method of a composition for light emitting device of the present embodiment may further include a step of calculating the value of MA.

In the production method (1), it is preferable that the compound (A) preparation step or the compound (B) sorting step further includes a step of calculating the value of MA.

In the production method (2), it is preferable that the compound (A) sorting step further includes a step of calculating the value of MA.

The production method of a composition for light emitting device of the present embodiment may further include a step of calculating the value of MB.

In the production method (1), it is preferable that the compound (B) sorting step further includes a step of calculating the value of MB.

In the production method (2), it is preferable that the compound (B) preparation step or the compound (A) sorting step further includes a step of calculating the value of MB.

The production method of a composition for light emitting device of the present embodiment may further include a step of calculating the value of MA+MB and the value of MA/(MA+MB).

In the production method (1), it is preferable that the compound (B) sorting step further includes a step of calculating the value of MA+MB and the value of MA/(MA+MB).

In the production method (2), it is preferable that the compound (A) sorting step further includes a step of calculating the value of MA+MB and the value of MA/(MA+MB).

In the production method of a composition for light emitting device of the present embodiment, $\Delta E^{ST}$ of the compound (B) is preferably 0.50 eV or less.

In the production method (1), it is preferable to sort the compound (B) in which $\Delta E^{ST}$ is 0.50 eV or less in the compound (B) sorting step.

In the production method (2), it is preferable to prepare the compound (B) in which $\Delta E^{ST}$ is 0.50 eV or less in the compound (B) preparation step.

In the production method of a composition for light emitting device of the present embodiment, the half-value width of the maximum peak of the emission spectrum at 25° C. of the compound (B) is preferably 50 nm or less.

In the production method (1), it is preferable to sort the compound (B) in which the half-value width of the maximum peak of the emission spectrum at 25° C. is 50 nm or less in the compound (B) sorting step.

In the production method (2), it is preferable to prepare the compound (B) in which the half-value width of the maximum peak of the emission spectrum at 25° C. is 50 nm or less in the compound (B) preparation step.

In the production method of a composition for light emitting device of the present embodiment, the maximum peak wavelength of the emission spectrum at 25° C. of the compound (B) is preferably 380 nm or more and 750 nm or less.

In the production method (1), it is preferable to sort the compound (B) in which the maximum peak wavelength of the emission spectrum at 25° C. is 380 nm or more and 750 nm or less in the compound (B) sorting step.

In the production method (2), it is preferable to prepare the compound (B) in which the maximum peak wavelength of the emission spectrum at 25° C. is 380 nm or more and 750 nm or less in the compound (B) preparation step.

The method of mixing compounds in the composition production step in the production method of a composition for light emitting device of the present embodiment is not particularly restricted. The mixing method includes, for example, a method of dissolving the compound (A) and the compound (B) in the solvent explained in the section of the ink described above and mixing them, a method of mixing the compound (A) and the compound (B) in solid state, a method of mixing the compound (A) and the compound (B) by co-vapor-deposition, and the like.

The composition for light emitting device obtained by the production method of a composition for light emitting device of the present embodiment includes, for example, compositions for light emitting device explained in the section of <Composition for light emitting device> described above.

Further, another aspect of the present invention may relate to a method for producing a light emitting device having an anode, a cathode, and an organic layer disposed between the anode and the cathode.

In one embodiment, the method for producing a light emitting device comprises a first step of producing a composition for light emitting device by the production method of a composition for light emitting device of the present embodiment, and a second step of disposing an organic layer containing the composition for light emitting device between an anode and a cathode. According to this embodiment, a light emitting device having low driving voltage can be produced easily.

In this embodiment, the organic layer can be formed using the same method as for the fabrication of the film described above. Further, in the production method of a light emitting device of the present embodiment, production methods explained in the section of <Light emitting device> described above may be used. Further, the light emitting device obtained by the production method of a light emitting device of the present embodiment includes, for example, light emitting devices explained in the section of <Light emitting device> described above.

Further, in another embodiment, the production method of a light emitting device comprises a step of preparing a first light emitting device having an anode, a cathode, and a first organic layer disposed between the anode and the cathode, and a step of producing a second light emitting device having a structure obtained by substituting the first organic layer with a second organic layer and having driving voltage lower than that of the first light emitting device. In this embodiment, the first organic layer contains the compound (A) and the compound (B) in a combination by which the molecular weight (MA) of the compound (A) and the molecular weight (MB) of the compound (B) do not satisfy the formula (M1-1) and the formula (M2-1). Meanwhile, the second organic layer contains the compound (A) and the compound (B) in a combination by which the molecular weight (MA) of the compound (A) and the molecular weight (MB) of the compound (B) satisfy the formula (M1-1) and the formula (M2-1).

In this embodiment, the production method of a light emitting device may further include an evaluation step of evaluating the first light emitting device. The evaluation step may be, for example, a step of evaluating the light emission efficiency [lm/W] and the like of the first light emitting device.

According to the production method of this embodiment, it is possible to easily produce a second light emitting device having driving voltage lower than that of the first light emitting device, using the first light emitting device as the base. For example, by investigating a device constitution in which performances other than the driving voltage are excellent by evaluating performances in a first light emitting device containing a cheap combination of the compound (A) and the compound (B) and then producing a second light emitting device, it is possible to easily produce a light emitting device excellent in both the performances and the driving voltage.

In this embodiment, the first organic layer and the second organic layer can be formed, for example, using the same method as for the fabrication of the film described above. Further, in the production method of the first light emitting device and the second light emitting device of the present embodiment, production methods explained in the section of <Light emitting device> described above may be used. Furthermore, the first light emitting device and the second light emitting device obtained by the production method of a light emitting device of the present embodiment include, for example, light emitting devices explained in the section of <Light emitting device> described above.

EXAMPLES

The present invention will be illustrated further in detail by examples below, by the present invention is not limited to these examples.

In examples, the molecular weight (MA) of the compound (A) and the molecular weight (MB) of the compound (B) were calculated using the value of Molecular Weight of ChemDraw Professional 16.0 (manufactured by HULINKS INC.).

For calculation of the value of $\Delta E_{ST}$ of a compound, the ground state of the compound was structurally optimized by density-functional approach at B3LYP level, and in this procedure, 6-31G* was used as the basis function. Using Gaussian09 as the quantum chemistry calculation program, $\Delta E_{ST}$ of the compound was calculated by time-dependent density-functional approach at B3LYP level.

In examples, the maximum peak wavelength of the emission spectrum of a compound at room temperature was measured by a spectrophotometer (manufactured by JASCO Corporation, FP-6500) at room temperature. A compound was dissolved in xylene at a concentration of about $8 \times 10^{-4}$% by mass and the resultant xylene solution was used as a specimen. As the excitation light, ultraviolet (UV) light having a wavelength of 325 nm was used.

<Acquisition and Synthesis of Compounds H1 to H7 and G1 to G7>

A compound H1 and a compound G2 manufactured by Luminescence Technology Corp. were used.

A compound H2, a compound H4, a compound H6 and a compound H7 were synthesized according to a method described in International Publication WO2017/170314.

A compound H3 was synthesized with reference to a method described in International Publication WO2017/038613.

A compound H5 manufactured by AK Scientific was used.

A compound G1 and compounds G3 to G7 were synthesized with reference to a method described in International Publication WO2015/102118.

[Chemical Formula 16]
compound H1
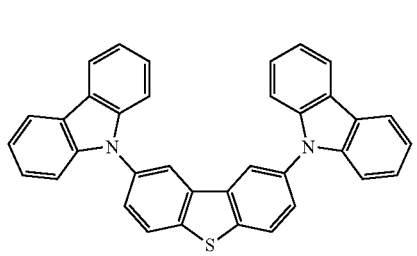
compound H2
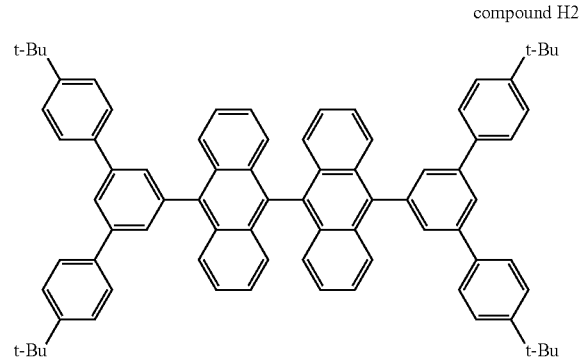
[Chemical Formula 17]
compound H3
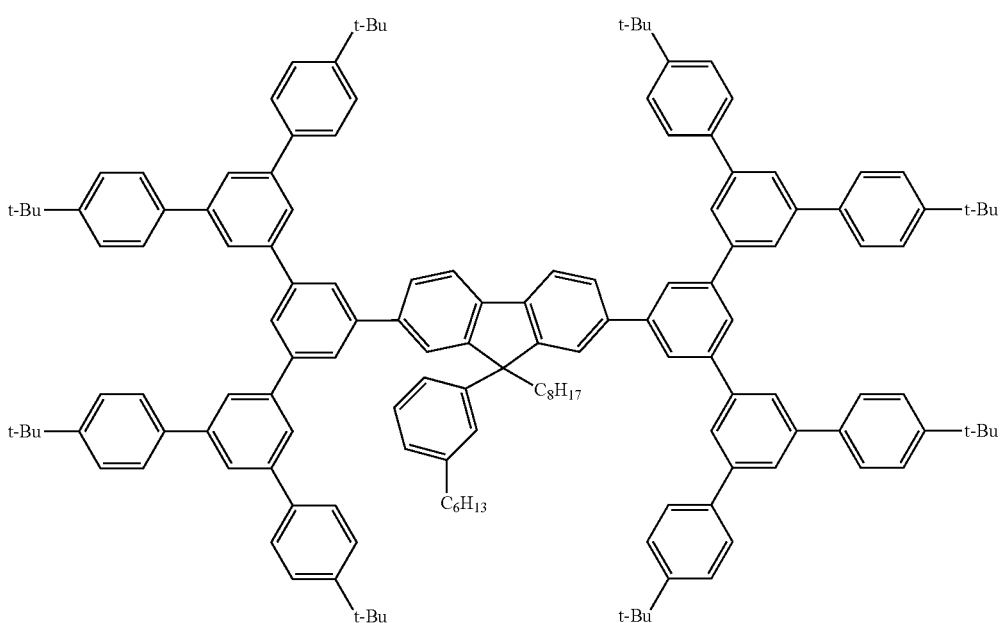
compound H4
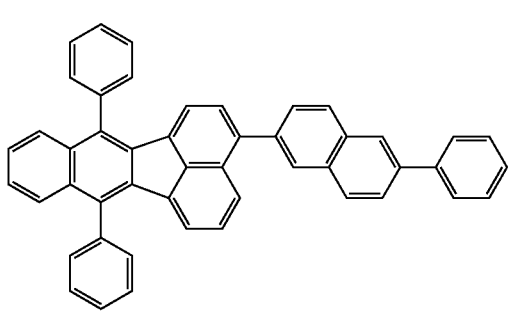

[Chemical Formula 18]
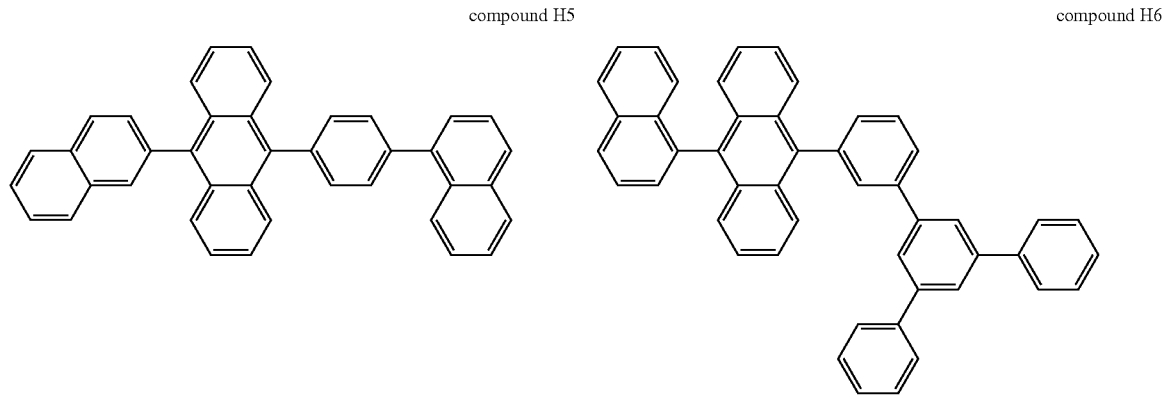
compound H5
compound H6
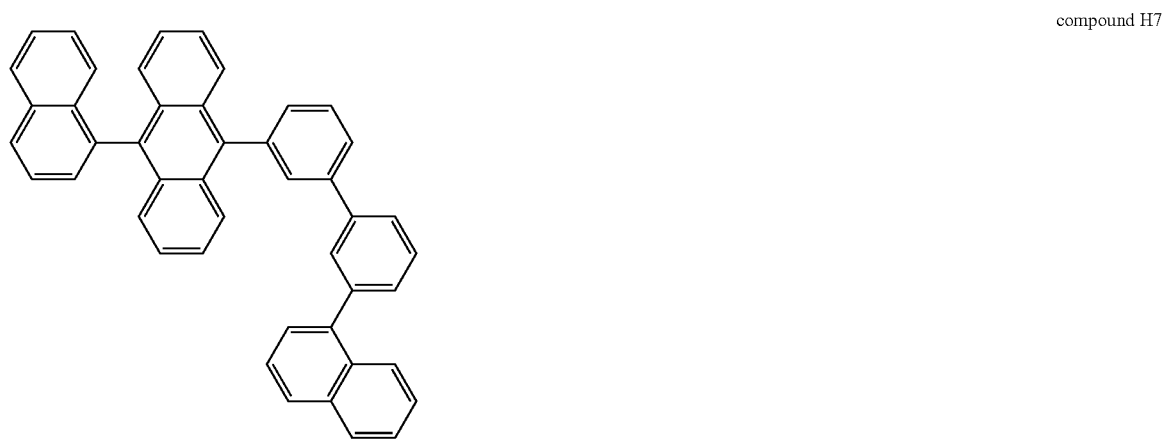
compound H7
[Chemical Formula 19]
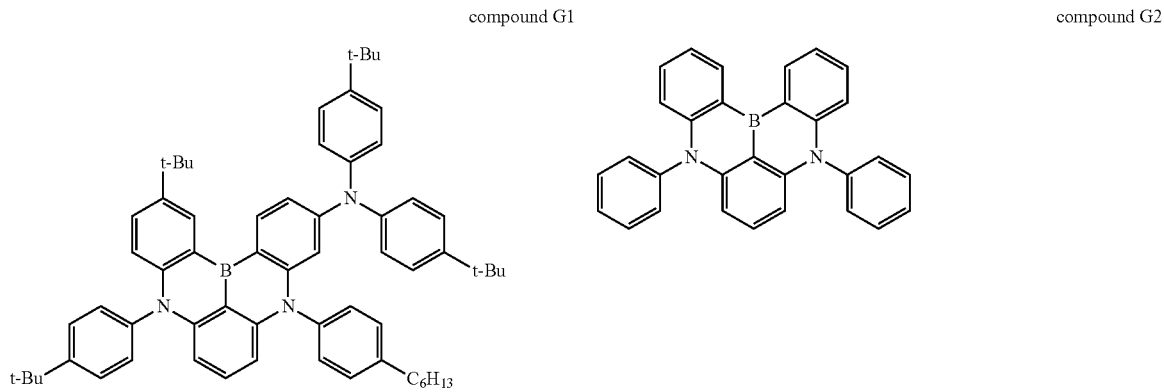
compound G1
compound G2

-continued
compound G3
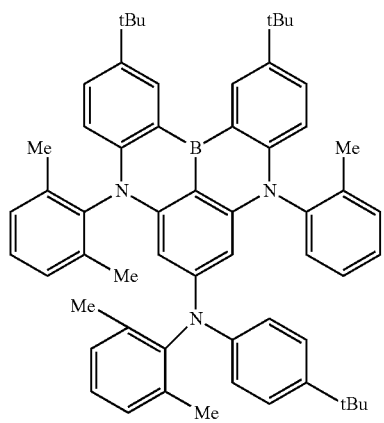
[Chemical Formula 20]
compound G4
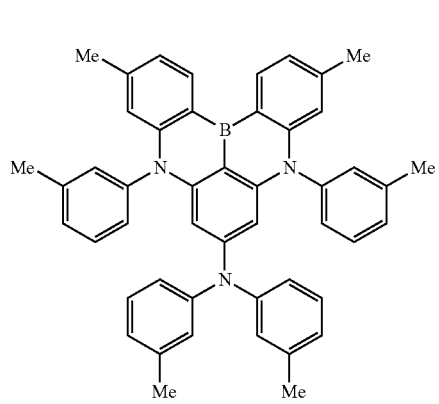
compound G5
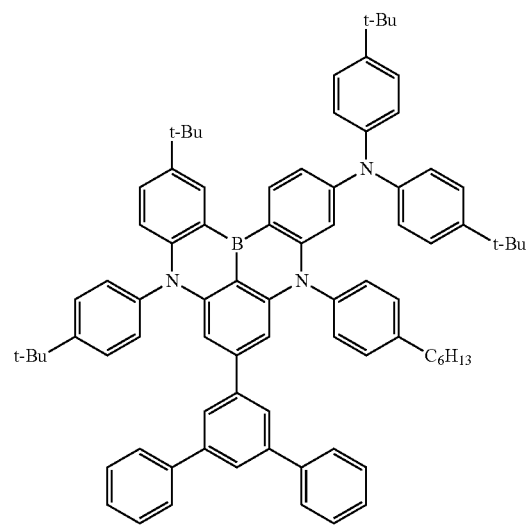
compound G6
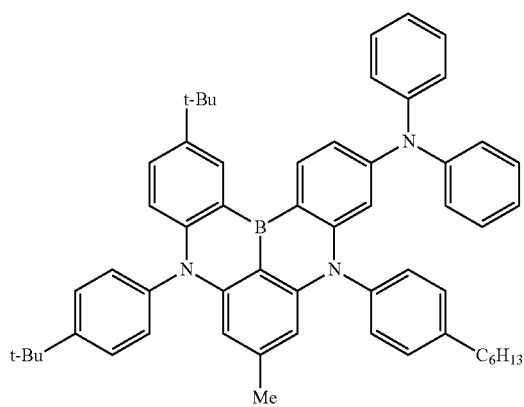

[Chemical Formula 21]

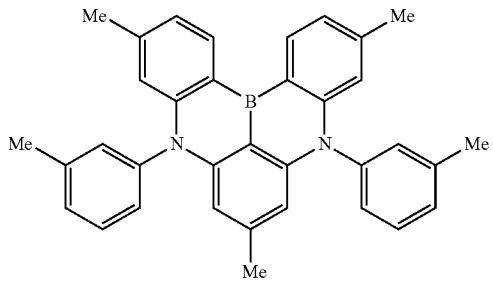

compound G7

The maximum peak wavelength of the emission spectrum at room temperature of the compound G1 was 453 nm. The half-value width of the maximum peak of the emission spectrum at room temperature of the compound G1 was 22 nm. $\Delta E^{ST}$ of the compound G1 was 0.457 eV.

The maximum peak wavelength of the emission spectrum at room temperature of the compound G2 was 452 nm. The half-value width of the maximum peak of the emission spectrum at room temperature of the compound G2 was 22 nm. $\Delta E^{ST}$ of the compound G2 was 0.494 eV.

The maximum peak wavelength of the emission spectrum at room temperature of the compound G3 was 445 nm. The half-value width of the maximum peak of the emission spectrum at room temperature of the compound G3 was 19 nm. $\Delta E^{ST}$ of the compound G3 was 0.448 eV.

The maximum peak wavelength of the emission spectrum at room temperature of the compound G4 was 440 nm. The half-value width of the maximum peak of the emission spectrum at room temperature of the compound G4 was 20 nm. $\Delta E^{ST}$ of the compound G4 was 0.471 eV.

The maximum peak wavelength of the emission spectrum at room temperature of the compound G5 was 467 nm. The half-value width of the maximum peak of the emission spectrum at room temperature of the compound G5 was 20 nm. $\Delta E^{ST}$ of the compound G5 was 0.457 eV.

The maximum peak wavelength of the emission spectrum at room temperature of the compound G6 was 452 nm. The half-value width of the maximum peak of the emission spectrum at room temperature of the compound G6 was 22 nm. $\Delta E^{ST}$ of the compound G6 was 0.447 eV.

The maximum peak wavelength of the emission spectrum at room temperature of the compound G7 was 444 nm. The half-value width of the maximum peak of the emission spectrum at room temperature of the compound G7 was 19 nm. $\Delta E^{ST}$ of the compound G7 was 0.475 eV.

<Example D1> Fabrication and Evaluation of Light Emitting Device D1

(Formation of Anode and Hole Injection Layer)

An ITO film was attached with a thickness of 45 nm to a glass substrate by a sputtering method, to form an anode. On the anode, a hole injection material ND-3202 (manufactured by Nissan Chemical Corp.) was spin-coated, to form a film with a thickness of 35 nm. The substrate carrying the hole injection layer laminated thereon was heated on a hot plate at 50° C. for 3 minutes, and further heated at 230° C. for 15 minutes, under an air atmosphere, to form a hole injection layer.

(Formation of Hole Transporting Layer)

The polymer compound HTL-1 was dissolved in xylene at a concentration of 0.7% by mass. The resultant xylene solution was spin-coated on the hole injection layer, to form a film with a thickness of 20 nm, and the film was heated on a hot plate at 180° C. for 60 minutes under a nitrogen gas atmosphere, to form a hole transporting layer. The polymer compound HTL-1 is a polymer compound of Polymer Example 1 in International Publication WO2014/102543.

(Formation of Light Emitting Layer)

The compound H1, the compound B3 and the compound B2 (compound H1/compound B3/compound B2=99% by mass/0.5% by mass/0.5% by mass) were dissolved at a concentration of 2% by mass in toluene. The resultant toluene solution was spin-coated on the hole transporting layer, to form a film with a thickness of 60 nm, and the film was heated at 130° C. for 10 minutes under a nitrogen gas atmosphere, to form a light emitting layer.

(Formation of Cathode)

The substrate carrying the light emitting layer formed thereon was placed in a vapor deposition machine and the internal pressure thereof was reduced to $1.0 \times 10^{-4}$ Pa or less, then, as the cathode, sodium fluoride was vapor-deposited with a thickness of about 4 nm on the light emitting layer, then, aluminum was vapor-deposited with a thickness of about 80 nm on the sodium fluoride layer. After vapor deposition, the substrate carrying the cathode formed thereon was sealed with a glass substrate, to fabricate a light emitting device D1.

(Evaluation of Light Emitting Device)

Voltage was applied to the light emitting device D1, to observe EL light emission. The driving voltage [V] at 100 mA/cm² was measured. The results are shown in Table 1.

<Examples D2 to D28 and Comparative Examples CD1 to CD4> Fabrication and Evaluation of Light Emitting Devices D2 to D28 and CD1 to CD4

Light emitting devices D2 to D28 and CD1 to CD4 were fabricated in the same manner as in Example D1, except that materials described in Table 1 were used instead of "the compound H5 and the compound G2 (compound H5/compound G2=99% by mass/1% by mass)" in (Formation of light emitting layer) of Example D1.

Voltage was applied to the light emitting devices D2 to D28 and CD1 to CD4, to observe EL emission. The driving voltage [V] at 100 mA/cm² was measured. The results are shown in Table 1.

TABLE 1

| | Light emitting device | Compound (A) material | MA | Compound (B) material | MB | MA + MB | MA/(MA + MB) | Composition ratio (% by mass) | Driving voltage [V] (100 mA/cm²) |
|---|---|---|---|---|---|---|---|---|---|
| Example D1 | D1 | H5 | 506.6 | G2 | 420.3 | 927 | 0.55 | 99/1 | 7.2 |
| Example D2 | D2 | H7 | 582.7 | G2 | 420.3 | 1003 | 0.58 | 99/1 | 7.3 |
| Example D3 | D3 | H4 | 606.8 | G2 | 420.3 | 1027 | 0.59 | 99/1 | 5.7 |
| Example D4 | D4 | H6 | 608.8 | G2 | 420.3 | 1029 | 0.59 | 99/1 | 7.1 |
| Example D5 | D5 | H5 | 506.6 | G7 | 490.5 | 997 | 0.51 | 99/1 | 7.4 |
| Example D6 | D6 | H7 | 582.7 | G7 | 490.5 | 1073 | 0.54 | 99/1 | 7.5 |
| Example D7 | D7 | H4 | 606.8 | G7 | 490.5 | 1097 | 0.55 | 99/1 | 6.0 |
| Example D8 | D8 | H6 | 608.8 | G7 | 490.5 | 1099 | 0.55 | 99/1 | 7.9 |
| Example D9 | D9 | H5 | 506.6 | G4 | 671.7 | 1178 | 0.43 | 99/1 | 7.6 |
| Example D10 | D10 | H7 | 582.7 | G4 | 671.7 | 1254 | 0.46 | 99/1 | 7.9 |
| Example D11 | D11 | H4 | 606.8 | G4 | 671.7 | 1279 | 0.47 | 99/1 | 6.0 |
| Example D12 | D12 | H6 | 608.8 | G4 | 671.7 | 1281 | 0.48 | 99/1 | 7.9 |
| Example D13 | D13 | H5 | 506.6 | G6 | 797.9 | 1305 | 0.39 | 99/1 | 7.4 |
| Example D14 | D14 | H7 | 582.7 | G6 | 797.9 | 1381 | 0.42 | 99/1 | 7.7 |
| Example D15 | D15 | H4 | 606.8 | G6 | 797.9 | 1405 | 0.43 | 99/1 | 5.7 |
| Example D16 | D16 | H6 | 608.8 | G6 | 797.9 | 1407 | 0.43 | 99/1 | 7.7 |
| Example D17 | D17 | H5 | 506.6 | G3 | 840.0 | 1347 | 0.38 | 99/1 | 7.2 |
| Example D18 | D18 | H7 | 582.7 | G3 | 840.0 | 1423 | 0.41 | 99/1 | 7.5 |
| Example D19 | D19 | H4 | 606.8 | G3 | 840.0 | 1447 | 0.42 | 99/1 | 5.9 |
| Example D20 | D20 | H6 | 608.8 | G3 | 840.0 | 1449 | 0.42 | 99/1 | 7.5 |
| Example D21 | D21 | H5 | 506.6 | G1 | 896.1 | 1403 | 0.36 | 99/1 | 7.3 |
| Example D22 | D22 | H7 | 582.7 | G1 | 896.1 | 1479 | 0.39 | 99/1 | 7.5 |
| Example D23 | D23 | H4 | 606.8 | G1 | 896.1 | 1503 | 0.40 | 99/1 | 5.7 |
| Example D24 | D24 | H6 | 608.8 | G1 | 896.1 | 1505 | 0.40 | 99/1 | 7.6 |
| Example D25 | D25 | H5 | 506.6 | G5 | 1124.4 | 1631 | 0.31 | 99/1 | 7.2 |
| Example D26 | D26 | H7 | 582.7 | G5 | 1124.4 | 1707 | 0.34 | 99/1 | 8.0 |
| Example D27 | D27 | H4 | 606.8 | G5 | 1124.4 | 1731 | 0.35 | 99/1 | 5.7 |
| Example D28 | D28 | H6 | 608.8 | G5 | 1124.4 | 1733 | 0.35 | 99/1 | 7.2 |
| Comparative Example CD1 | CD1 | H1 | 514.6 | G1 | 896.1 | 1411 | 0.36 | 99/1 | 9.0 |
| Comparative Example CD2 | CD2 | H2 | 1035.5 | G5 | 1124.4 | 2160 | 0.48 | 99/1 | 10.2 |
| Comparative Example CD3 | CD3 | H2 | 1035.5 | G2 | 420.3 | 1456 | 0.71 | 99/1 | 9.8 |
| Comparative Example CD4 | CD4 | H3 | 1952.9 | G2 | 420.3 | 2373 | 0.82 | 99/1 | 10.2 |

The invention claimed is:

1. A method for producing a light emitting device having an anode, a cathode, and an organic layer disposed between said anode and said cathode, comprising:

a step of preparing a first light emitting device comprising an anode, a cathode, and a first organic layer disposed between the anode and the cathode;

a step of evaluating a performance of the first light emitting device; and a step of producing a second light emitting device comprising the anode, the cathode, and a second organic layer disposed between the anode and the cathode, wherein the second light emitting device has a driving voltage lower than that of the first light emitting device, wherein said first organic layer contains a compound (A1) represented by the formula (FH) and a compound (B1) having a condensed hetero ring skeleton (b) containing a boron atom and a nitrogen atom in the ring in a combination by which the molecular weight (MA) of said compound (A1) and the molecular weight (MB) of said compound (B1) do not satisfy the formula (M1-1) and the formula (M2-1), and said second organic layer contains a compound (A2) represented by the formula (FH) and a compound (B2) having a condensed hetero ring skeleton (b) containing a boron atom and a nitrogen atom in the ring in a combination by which the molecular weight (MA) of said compound (A2) and the molecular weight (MB) of said compound (B2) satisfy the formula (M1-1) and the formula (M2-1):

$$400 \leq MA + MB \leq 2000 \quad (M1\text{-}1)$$

$$0.30 \leq MA/(MA + MB) \leq 0.70 \quad (M2\text{-}1)$$

(FH)

wherein, $n^{1H}$ represents an integer of 0 or more, $Ar^{1H}$ represents a group obtained by removing from an aromatic hydrocarbon $n^{1H}$ or more hydrogen atoms bonding directly to atoms constituting the ring, and this group optionally has a substituent, when a plurality of the substituents are present, they may be the same or different and may be combined together to form a ring together with atoms to which they are attached, $R^{1H}$ represents an aryl group, a monovalent hetero ring group or a substituted amino group, and these groups optionally have a substituent, when a plurality of the substituents are present, they may be the same or different and may be combined together to form a ring together with atoms to which they are attached, when a plurality of $R^{1H}$ are present, they may be the same or different, said monovalent hetero ring group is a group obtained by removing from a heterocyclic compound not having said condensed hetero ring skeleton (b) one hydrogen atom bonding directly to an atom constituting the ring, and this group optionally has a substituent.

2. The method according to claim 1, wherein said aromatic hydrocarbon represented by said $Ar^{1H}$ is a polycyclic aromatic hydrocarbon.

3. The method according to claim 2, wherein said polycyclic aromatic hydrocarbon represented by said $Ar^{1H}$ is a tricyclic, tetracyclic or pentacyclic aromatic hydrocarbon.

4. The method according to claim 1, wherein the compound (B1) and the compound (B2) are each independently a compound having formula (1-1), a compound having formula (1-2), or a compound having formula (1-3):

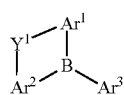

(1-1)

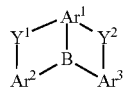

(1-2)

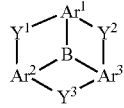

(1-3)

wherein,
$Ar^1$, $Ar^2$ and $Ar^3$ each independently represent an aromatic hydrocarbon group or a hetero ring group, and these groups optionally have a substituent, when a plurality of the substituents are present, they may be the same or different and may be combined together to form a ring together with atoms to which they are attached, $Y^1$ represents a group represented by —N(Ry)-, $Y^2$ and $Y^3$ each independently represent a single bond, an oxygen atom, a sulfur atom, a selenium atom, a group represented by —N(Ry)-, an alkylene group or a cycloalkylene group, and these groups optionally have a substituent, when a plurality of the substituents are present, they may be the same or different and may be combined together to form a ring together with atoms to which they are attached, Ry represents a hydrogen atom, an alkyl group, a cycloalkyl group, an aryl group, or a monovalent hetero ring group, and these groups optionally have a substituent, when a plurality of the substituents are present, they may be the same or different and may be combined together to form a ring together with atoms to which they are attached, when a plurality of Ry are present, they may be the same or different, Ry may be bonded directly or via a connecting group to $Ar^1$, $Ar^2$ or $Ar^3$.

5. The method according to claim 4, wherein the $Y^2$ and the $Y^3$ are groups represented by —N(Ry)-.

6. The method according to claim 1, wherein the first organic layer and the second organic layer further contain at least one selected from the group consisting of a hole transporting material, a hole injection material, an electron transporting material, an electron injection material, a light emitting material, an antioxidant and a solvent.

* * * * *